United States Patent
Ueno et al.

(10) Patent No.: US 7,858,963 B2
(45) Date of Patent: Dec. 28, 2010

(54) NITRIDE BASED SEMICONDUCTOR OPTICAL DEVICE, EPITAXIAL WAFER FOR NITRIDE BASED SEMICONDUCTOR OPTICAL DEVICE, AND METHOD OF FABRICATING SEMICONDUCTOR LIGHT-EMITTING DEVICE

(75) Inventors: Masaki Ueno, Itami (JP); Yohei Enya, Itami (JP); Takashi Kyono, Itami (JP); Katsushi Akita, Itami (JP); Yusuke Yoshizumi, Itami (JP); Takamichi Sumitomo, Itami (JP); Takao Nakamura, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 12/752,647

(22) Filed: Apr. 1, 2010

(65) Prior Publication Data

US 2010/0213439 A1 Aug. 26, 2010

Related U.S. Application Data

(63) Continuation of application No. PCT/JP2009/050992, filed on Jan. 22, 2009.

(30) Foreign Application Priority Data

Sep. 11, 2008 (JP) ............................ 2008-233806

(51) Int. Cl.
*H01L 33/00* (2010.01)
(52) U.S. Cl. .................. 257/14; 257/103; 257/E33.034
(58) Field of Classification Search .................. 257/14, 257/96, 103, E33.034
See application file for complete search history.

(56) References Cited

U.S. PATENT DOCUMENTS 6,844,572 B2   1/2005   Sawaki et al.

(Continued)

FOREIGN PATENT DOCUMENTS

JP         10-012960         1/1998

(Continued)

OTHER PUBLICATIONS

Takeuchi et al., "Theoretical Study of Orientation Dependence of Piezoelectric Effects in Wurtzite Strained GaInN/GaN Heterostructures and Quantum Wells", Japanese Journal of Applied Physics, Feb. 2000, pp. 413-416, vol. 39, Part 1, No. 2A.

(Continued)

*Primary Examiner*—Minh-Loan T Tran
(74) *Attorney, Agent, or Firm*—Venable LLP; Michael A. Sartori; Steven J. Schwarz

(57) ABSTRACT

In the nitride based semiconductor optical device LE1, the strained well layers 21 extend along a reference plane SR1 tilting at a tilt angle α from the plane that is orthogonal to a reference axis extending in the direction of the c-axis. The tilt angle α is in the range of greater than 59 degrees to less than 80 degrees or greater than 150 degrees to less than 180 degrees. A gallium nitride based semiconductor layer P is adjacent to a light-emitting layer SP– with a negative piezoelectric field and has a band gap larger than that of a barrier layer. The direction of the piezoelectric field in the well layer W3 is directed in a direction from the n-type layer to the p-type layer, and the piezoelectric field in the gallium nitride based semiconductor layer P is directed in a direction from the p-type layer to the n-type layer. Consequently, the valence band, not the conduction band, has a dip at the interface between the light-emitting layer SP– and the gallium nitride based semiconductor layer P.

11 Claims, 15 Drawing Sheets

U.S. PATENT DOCUMENTS

| | | |
|---|---|---|
| 2001/0010372 A1 | 8/2001 | Takeuchi et al. |
| 2002/0008242 A1 | 1/2002 | Hata |
| 2002/0084467 A1 | 7/2002 | Krames et al. |
| 2003/0089917 A1 | 5/2003 | Krames et al. |
| 2003/0178702 A1 | 9/2003 | Sawaki et al. |
| 2005/0230690 A1 | 10/2005 | Hata |

FOREIGN PATENT DOCUMENTS

| | | |
|---|---|---|
| JP | 10-135576 | 5/1998 |
| JP | 11-112029 | 4/1999 |
| JP | 2000232259 | 8/2000 |
| JP | 2001251022 | 9/2001 |
| JP | 2003158294 | 5/2003 |
| JP | 2003347585 | 12/2003 |
| JP | 2005-175056 | 6/2005 |
| JP | 2006134987 | 5/2006 |
| JP | 2007235107 | 9/2007 |
| JP | 2008177438 | 7/2008 |
| WO | WO-2006109418 | 10/2006 |
| WO | WO-2006130696 | 12/2006 |
| WO | WO-2007009035 | 1/2007 |

OTHER PUBLICATIONS

Seoung-Hwan Park, "Crystal Orientation Effects on Electronic Properties of Wurtzite InGaN/GaN Quantum Wells", Journal of Applied Physics, Jun. 15, 2002, pp. 9904-9908, vol. 91, No. 12.

Tyagi et al., "High Brightness Violet InGaN/GaN Light Emitting Diodes on Semipolar (1011) Bulk GaN Substrates", Japanese Journal of Applied Physics, 2007, pp. L129-L131, vol. 46, No. 7.

Takeuchi et al., "Quantum-Confined Stark Effect Due to Piezoelectric Fields in GaInN Strained Quantum Wells", Japanese Journal of Applied Physics, Apr. 1, 2007, pp. L382-L385, vol. 36, Part 2, No. 4A.

(a)

(b)

(c)

(d)

(a)

(b)

(c)

(a)

(b)

(c)

(a)

(b)

(a)

(b)

NITRIDE BASED SEMICONDUCTOR OPTICAL DEVICE, EPITAXIAL WAFER FOR NITRIDE BASED SEMICONDUCTOR OPTICAL DEVICE, AND METHOD OF FABRICATING SEMICONDUCTOR LIGHT-EMITTING DEVICE

CROSS REFERENCE TO RELATED APPLICATIONS

This is a continuation of a application PCT application No. PCT/JP2009/050992 filed on Jan. 22, 2009, claiming the benefit of priorities from Japanese Patent application No. 2008-233806 filed on Sep. 11, 2008, and incorporated by reference in their entirety.

TECHNICAL FIELD

The present invention relates to a nitride based semiconductor optical device, an epitaxial wafer for a nitride based semiconductor optical device, and the method of fabricating a semiconductor light-emitting device.

BACKGROUND ART

Patent Document 1 discloses a semiconductor optical device. In the semiconductor optical device, a piezoelectric field in a strained layer does not occur at all in a direction tilted at an angle of about 40 degrees, 90 degrees, and 140 degrees defined with reference to the [0001] direction. Accordingly, a plane orientation is selected within the angle range of 30 to 50 degrees, 80 to 100 degrees, or 130 to 150 degrees. Epitaxial growth occurs onto the surface of a substrate on which little or no piezoelectric field is generated in a strained quantum-well structure.

Patent Document 2 discloses a semiconductor light-emitting device. This semiconductor light-emitting device is formed on a nonpolar plane. The nonpolar plane encompasses a {11-20} plane, a plane tilted from the {11-20} plane at an angle in the range of −5 to +5 degrees, a {1-100} plane, or a plane tilted from the {1-100} plane at an angle in the range of −5 to +5 degrees.

Non-Patent Document 1 discloses a theoretical study of dependence of the piezoelectric effect on crystal orientation in an InGaN/GaN heterostructure of a wurtzite structure. A strained layer grown in a crystal orientation at an off-angle of 39 degrees or 90 degrees with reference to (0001) does not induce the longitudinal component of the piezoelectric field. Furthermore, Non-Patent Document 2 discloses the effect of crystal orientation in relation to electrical characteristics of an InGaN/GaN quantum-well of a wurtzite structure. The internal electric field of the InGaN/GaN quantum-well structure changes its sign around at an off-angle of about 55 degrees.

[Patent Document 1] Japanese Unexamined Patent Application Publication No. 11-112029 (Japanese Patent Application No. 09-263511)

[Patent Document 2] Japanese Unexamined Patent Application Publication No. 10-135576

[Non-Patent Document 1] Jpn. J. Appl. Phys., vol. 39 (2000), pp. 413-416. Part 1. No. 2A, February

[Non-Patent Document 2] J. Appl. Phys., Vol. 91, No. 12, 15 Jun. 2002, pp. 9904-9908.

DISCLOSURE OF INVENTION

Problems to be Solved by the Invention

A significantly large piezoelectric field is generated in an InGaN well layer grown on a (0001) plane of a gallium nitride based semiconductor. The piezoelectric field spatially separates the wave function of electrons from that of holes in an active layer, thereby lowering light-emitting efficiency of a light-emitting device. Furthermore, in the light-emitting device, carriers injected into the active layer screen the piezoelectric field therein as the applied current is increased. Such screening causes a blue shift of the emission wavelength with the increase in the applied current.

In Patent Document 2, in order to avoid a large blue shift, the active layer is formed on a {11-20} plane or a {1-100} plane, which defines an angle of 90 degrees with the (0001) plane.

In Patent Document 1, in order to avoid a large blue shift, an off-angle of 40 degrees or 140 degrees, at which the internal electrical field of the active layer is zero, is used. In Non-Patent Document 1, the off-angle at which the internal electrical field is zero is estimated through theoretical calculation.

However, in order to fabricate a wafer having a primary surface of a {11-20} plane or a {10-10} plane, i.e., a nonpolar primary surface, a ingot thick grown in the (0001) plane direction is cut out to form a crystal piece such that the primary surface has the plane orientation mentioned above. Since the ingot is cut out in its longitudinal direction, the width of the cut-out crystal piece is about 10 millimeters at most.

In Patent Documents 1 and 2, plane orientation that makes the piezoelectric field zero or near zero is utilized. Inventors' investigations have revealed that, unlike the inventions of Patent Documents 1 and 2, utilizing a piezoelectric field with a non-zero magnitude can enhance performances of semiconductor light-emitting devices.

It is an object of the present invention to provide a nitride based semiconductor optical device that includes a light-emitting layer of a strained hexagonal group III nitride and can suppress overflow of electrons from the light-emitting layer. It is another object of the present invention to provide an epitaxial wafer for the nitride based semiconductor optical device. Furthermore, it is yet another object of the present invention to provide a method of fabricating a semiconductor light-emitting device that includes a light-emitting layer of a strained hexagonal group III nitride.

Means for Solving the Problems

A nitride based semiconductor optical device according to one aspect of the present invention includes (a) a first gallium nitride based semiconductor region; (b) a light-emitting layer including a well layer and a barrier layer, the well layer being composed of a strained hexagonal gallium nitride based semiconductor, and the barrier layer being composed of gallium nitride based semiconductor; and (c) a second gallium nitride based semiconductor region. The light-emitting layer is provided between the first gallium nitride based semiconductor region and the second gallium nitride based semiconductor region. The first gallium nitride based semiconductor region includes one or more n-type gallium nitride semiconductor layers. The second gallium nitride based semiconductor region includes a gallium nitride based semiconductor layer and one or more p-type gallium nitride semiconductor layers, and the gallium nitride based semiconductor layer has a band gap larger than that of the barrier layer. Each of the well layer and the barrier layer extends along a reference plane, and the reference plane tilts at a tilt angle in the range of 59 degrees to less than 80 degrees and greater than 150 degrees to less than 180 degrees from a plane orthogonal to a reference axis extending in the direction of a c-axis. A piezoelectric field in the light-emitting layer includes a component of a direction opposite to a direction from the second gallium nitride based semiconductor region toward the first gallium nitride based semiconductor region. The gallium nitride based semiconductor layer of the second gallium nitride based semiconductor region is adjacent to the light-emitting layer; and the gallium nitride based semiconductor layer of the second gallium nitride based semiconductor region includes one of an electron blocking layer and a cladding layer.

In the nitride based semiconductor optical device, since each of the well layer and the barrier layer extends along a reference plane tilting at a tilt angle within the above-mentioned range, the piezoelectric field in the light-emitting layer includes a component of the direction that is opposite to the direction from the second gallium nitride based semiconductor region toward the first gallium nitride based semiconductor region, whereas the piezoelectric field in the gallium nitride semiconductor layer includes a component of the direction that is the same as the direction from the second gallium nitride based semiconductor region toward the first gallium nitride based semiconductor region. Since the light-emitting layer and the gallium nitride semiconductor layer of the second gallium nitride based semiconductor region are adjacent to each other, the valence band, not the conduction band, has a dip at the interface between the gallium nitride semiconductor layer and the light-emitting layer. Accordingly, the conduction band has no dip thereat, so that overflow of electrons can be reduced.

In the nitride based semiconductor optical device according to the present invention, the well layer may be composed of InGaN, and the barrier layer may be composed of GaN or InGaN. According to this nitride based semiconductor optical device, the lattice constants in the directions of the a-axis and the c-axis in InN are larger than those in the directions of the a-axis and the c-axis in GaN, respectively. Consequently, the InGaN well layer is strained due to stress from the barrier layer.

In the nitride based semiconductor optical device according to the present invention, the tilt angle may be in the range of 62 degrees to less than 80 degrees. This nitride based semiconductor optical device exhibits reduced blue shift. Alternatively, in the nitride based semiconductor optical device according to the present invention, the tilt angle may be in the range of greater than 150 degrees to 170 degrees. This nitride based semiconductor optical device also exhibits reduced blue shift.

The nitride based semiconductor optical device according to the present invention may include a substrate composed of a hexagonal semiconductor $In_SAl_TGa_{1-S-T}N$ ($0 \leq S \leq 1$, $0 \leq T \leq 1$, $0 \leq S+T \leq 1$). The primary surface of the substrate extends along a plane tilting at a tilt angle in the range of greater than 59 degrees to less than 80 degrees or greater than 150 degrees to less than 180 degrees with reference to a plane orthogonal to the c-axis of the hexagonal semiconductor. The first gallium nitride based semiconductor region, the light-emitting layer, and the second gallium nitride based semiconductor region are arranged on the primary surface of the substrate in the direction of a predetermined axis.

In the nitride based semiconductor optical device, by use of the above substrate, the piezoelectric field in the light-emitting layer includes a component of the direction that is opposite to the direction from the second gallium nitride based semiconductor region toward the first gallium nitride based semiconductor region.

In the nitride based semiconductor optical device according to the present invention, the substrate includes a plurality of first regions and a plurality of second regions. The first regions has the density of threading dislocations, which is larger than a first threading dislocation density, extending in the c-axis direction, and the second regions has the density of threading dislocations, which is smaller than the first threading dislocation density, extending in the c-axis direction. The first and second regions are alternately arranged and are exposed at the primary surface of the substrate.

In this nitride based semiconductor optical device, since the light-emitting layer is grown on the second regions, the light emission characteristics are less affected by the threading dislocation density thereof.

In the nitride based semiconductor optical device according to the present invention, the second regions can have a threading dislocation density of less than $1 \times 10^7$ cm$^{-2}$. This nitride based semiconductor optical device can provide a light-emitting layer having excellent light emission characteristics.

In the nitride based semiconductor optical device according to the present invention, the first gallium nitride based semiconductor region, the light-emitting layer, and the second gallium nitride based semiconductor region constitute a semiconductor laminate, which is provided on the primary surface of the substrate, and the substrate has electrical conductivity. The hexagonal nitride based semiconductor optical device may include a first electrode provided on the semiconductor laminate and a second electrode provided on the back side of the substrate. According to the nitride based semiconductor optical device, both of the anode and the cathode not are provided on the same upper face of the epitaxial laminate.

In the nitride based semiconductor optical device according to the present invention, the light-emitting layer may include first and second optical guide layers and an active layer having a quantum-well structure, and the quantum-well structure may include the well layer and the barrier layer. The active layer may be provided between the first optical guide layer and the second optical guide layer. This nitride based semiconductor optical device can provide a semiconductor laser.

In the nitride based semiconductor optical device according to the present invention, the reference plane may tilt toward the direction of the a-axis. The tilt toward the direction of the a-axis allows m-plane cleavage in the nitride based semiconductor optical device.

In the nitride based semiconductor optical device according to the present invention, the reference plane may tilt toward the direction of the m-axis. The tilt toward the direction of the m-axis allows m-plane cleavage in the nitride based semiconductor optical device.

In the nitride based semiconductor optical device according to the present invention, the gallium nitride based semiconductor layer of the second gallium nitride based semiconductor region may be composed of p-type $Al_XGa_YIn_{1-X-Y}N$ ($0<X \leq 1$, $0 \leq Y \leq 1$, $0<X+Y \leq 1$) that contains at least aluminum. This nitride based semiconductor optical device can efficiently confine carriers into the light-emitting layer.

Another aspect of the present invention relates to an epitaxial wafer for a nitride based semiconductor optical device. The epitaxial wafer comprises: (a) a first gallium nitride based semiconductor region; (b) a light-emitting layer including a strained well layer and a barrier layer, the well layer being composed of a hexagonal gallium nitride based semiconductor, and the barrier layer being composed of a gallium nitride based semiconductor; (c) a second gallium nitride based semiconductor region; and (d) a wafer of a hexagonal semiconductor of $In_SAl_TGa_{1-S-T}N$ ($0 \leq S \leq 1$, $0 \leq T \leq 1$, $0 \leq S+T \leq 1$). The light-emitting layer is provided between the first gallium nitride based semiconductor region and the second gallium nitride based semiconductor region on the wafer. The first gallium nitride based semiconductor region includes one or more n-type gallium nitride semiconductor layers. The second gallium nitride based semiconductor region includes a gallium nitride based semiconductor layer and one or more p-type gallium nitride based semiconductor layers, and the gallium nitride based semiconductor layer has a band gap larger than that of the barrier layer. Each of the well layer and the barrier layer extends along a reference plane, and the reference plane tilts at a tilt angle in a range of one of 59 degrees to less than 80 degrees and greater than 150 degrees to less than 180 degrees from a plane orthogonal to a reference axis extending in a direction of a c-axis. A piezoelectric field in the light-emitting layer includes a component of a direction opposite to a direction from the second gallium nitride based semiconductor region toward the first gallium nitride based semiconductor region. The gallium nitride based semiconductor layer of the second gallium nitride based semiconductor region is adjacent to the light-emitting layer, and the gallium nitride based semiconductor layer of the second gallium nitride based semiconductor region includes one of an electron blocking layer and a cladding layer. The barrier layer comprises one of GaN and InGaN.

In this epitaxial wafer, since each of the well layer and the barrier layer extend along the reference plane that tilts at a tilt angle in the above-mentioned range, the piezoelectric field in the light-emitting layer includes a component in the direction that is opposite to the direction from the second gallium nitride based semiconductor region toward the first gallium nitride based semiconductor region. On the other hand, the piezoelectric field in the gallium nitride based semiconductor layer includes a component in the direction that is the same as the direction from the second gallium nitride based semiconductor region toward the first gallium nitride based semiconductor region. Since the gallium nitride based semiconductor layer of the second gallium nitride based semiconductor region is in contact with the light-emitting layer, a dip is formed in the valence band, not the conduction band, at the interface between the gallium nitride semiconductor layer and the light-emitting layer. The dip in the valence band, not the conductive band, can reduce overflow of electrons.

In the epitaxial wafer according to the present invention, the primary surface of the wafer may extend along a plane tilting at a tilt angle in the range of 59 degrees to less than 80 degrees or greater than 150 degrees to 170 degrees with reference to a plane orthogonal to the c-axis of the hexagonal semiconductor. According to the epitaxial wafer, the well layer and the barrier layer are provided so as to extend along respective reference planes each tilting at a tilt angle in the above-mentioned range by adjusting the tilt angle of the primary surface of the wafer within the above-mentioned range.

In the epitaxial wafer according to the present invention, the maximum distance between two points on the edge of the wafer may be 45 millimeters or more. According to the epitaxial wafer, a wafer with a large diameter can be provided, unlike those of a primary surface of the a-plane or the m-plane. In the epitaxial wafer according to the present invention, the wafer may be composed of electrically conductive GaN.

In the method according to the present invention, the first gallium nitride based semiconductor region, the light-emitting layer, and the second gallium nitride based semiconductor region are arranged on the primary surface of the wafer in the direction of a predetermined axis. The direction of the reference axis is different from the direction of the predetermined axis. In this method, the direction of the above arrangement is the same as the direction of a predetermined axis, and the epitaxial growth occurs in the direction of the reference axis.

In the epitaxial wafer according to the present invention, the tilt angle may be in the range of 62 degrees to less than 80 degrees. This epitaxial wafer can provide a nitride based semiconductor optical device with a small blue shift. Alternatively, in the epitaxial wafer according to the present invention, the tilt angle may be in the range of greater than 150 degrees to less than 170 degrees. This epitaxial wafer can also provide a nitride based semiconductor optical device with a small blue shift.

Yet another aspect of the present invention relates to a method of fabricating a semiconductor light-emitting device, and the semiconductor light-emitting device includes a light-emitting layer of a strained hexagonal group III nitride. The method comprises the steps of: (a) choosing a plane orientation for the light-emitting layer for estimating a direction of a piezoelectric field in the light-emitting layer; (b) forming a quantum well structure for estimating the direction of the piezoelectric field in the light-emitting layer, and p-type and n-type gallium nitride semiconductors to prepare a substrate product, the quantum well structure being formed in the chosen plane orientation; (c) measuring photoluminescence of the substrate product while applying voltage across the substrate product, to obtain a voltage dependency of photoluminescence; (d) estimating the direction of the piezoelectric field in the light-emitting layer based on the measured voltage dependency; (e) preparing a wafer having a primary surface for forming the light-emitting layer with the chosen plane orientation; and (f) forming a semiconductor laminate for the semiconductor light-emitting device on the primary surface of the wafer. The semiconductor laminate includes a first gallium nitride based semiconductor region, the light-emitting layer, and a second gallium nitride based semiconductor region. The light-emitting layer includes a well layer of gallium nitride based semiconductor and a barrier layer of gallium nitride based semiconductor, and the light-emitting layer is provided between the first gallium nitride based semiconductor region and the second gallium nitride based semiconductor region. The first gallium nitride based semiconductor region includes one or more n-type gallium nitride based semiconductor layers. The second gallium nitride based semiconductor region includes a gallium nitride based semiconductor layer and one or more p-type gallium nitride based semiconductor layers, and the gallium nitride based semiconductor layer has a band gap larger than that of the barrier layer. The gallium nitride based semiconductor layer in the second gallium nitride based semiconductor region is adjacent to the light-emitting layer. Each of the well layer and the barrier layer extends along a reference plane, and the reference plane tilts from a plane orthogonal to a reference axis extending in a direction of each of a c-axis, the a-axis and the m-axis. A direction of the piezoelectric field is defined with reference to a direction from the second gallium nitride based semiconductor region toward the first gallium nitride based semiconductor region.

In this method, in order to estimate the dependency of PL on bias voltage, photoluminescence (PL) spectra of the substrate product are measured while voltage is applied to the substrate product. These PL spectra can be measured in the range of positive and negative voltages that are smaller than the applied voltage at which emission of light is caused by electroluminescence (EL). The bias dependency of PL spectra provides estimation of the magnitude and direction of the internal electrical field in the light-emitting layer. This estimation can be utilized to form a light-emitting device with a piezoelectric field in a desired direction.

Advantages

As described above, one aspect of the present invention provides a nitride based semiconductor optical device that includes a light-emitting layer of a strained hexagonal group III nitride and can suppress overflow of electrons from the light-emitting layer. In addition, another aspect of the present invention provides an epitaxial wafer for this nitride based semiconductor optical device. A further aspect of the present invention provides a method of fabricating a semiconductor light-emitting device including a light-emitting layer of a strained hexagonal group III nitride.

BRIEF DESCRIPTION OF DRAWINGS

The foregoing and other objects, features, and advantages of the present invention will become more readily apparent from the following detailed description of the preferred embodiments of the present invention with reference to the accompanying drawings.

REFERENCE NUMERALS

Figure 1:
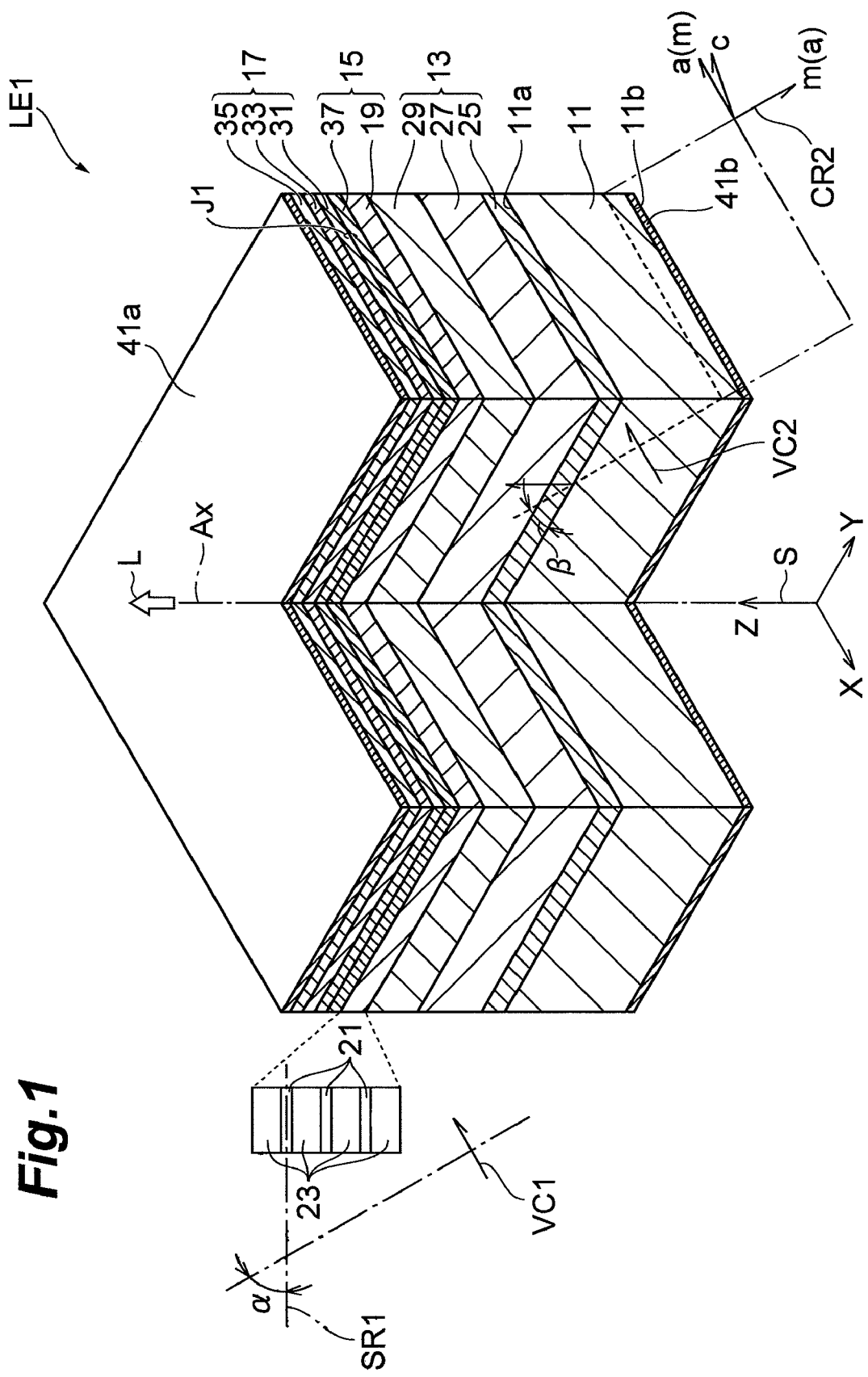
FIG. 1 is a schematic diagram showing the structure of a nitride based semiconductor optical device according to an embodiment of the present invention.

LE1, LD1: nitride based semiconductor optical device,
13: first gallium nitride based semiconductor region,
15: light-emitting region,
17: second gallium nitride based semiconductor region,
19: active layer,
21: well layer,
23: barrier layer,
25, 27, 29: gallium nitride based semiconductor layer,
31: gallium nitride based semiconductor layer,
33, 35: gallium nitride based semiconductor layer,
α, β: tilt angle,
SR1: reference plane,
B1, B2, B3, B4, B5, B6: barrier layer,
W1, W2, W3: well layer,
P, NP, SP+, SP−: light-emitting layer,
37: undoped GaN layer ($N_2$-GaN layer),
39: undoped GaN layer,
41a, 41b: electrode,
VC1, VC2: vector that indicates the c-axis direction,
51, 53: gallium nitride based semiconductor layer,
55, 57: gallium nitride based semiconductor layer,
59a, 59b: optical guide layer,
61: undoped GaN layer,
63: insulating film,
65, 67: electrode.

BEST MODES FOR CARRYING OUT THE INVENTION

The teachings of the present invention can be readily understood in consideration of the following detailed description with reference to accompanying drawings shown as examples. Subsequently, with reference to the accompanying drawings, embodiments of the nitride based semiconductor optical device, the epitaxial wafer for the nitride based semiconductor optical device, and the method of fabricating the semiconductor light-emitting device will be described. The same portions are denoted by the same reference numerals, if possible.

FIG. 1 is a schematic diagram showing the structure of a nitride based semiconductor optical device according to an embodiment. The nitride based semiconductor optical device encompasses, for example, a semiconductor laser and a light-emitting diode. In FIG. 1, a coordinate system S is shown. The primary surface 11a of a substrate 11 is directed to the Z-axis direction and extends in the X-axis and Y-axis directions. The X-axis is directed to in the a-axis direction. In the following description, for example, the crystal axis in opposite to the <0001> axis is represented by <000-1>.

A nitride based semiconductor optical device LE1 has a structure suitable for a light-emitting diode. The nitride based semiconductor optical device LE1 includes a first gallium nitride based semiconductor region 13, a light-emitting region 15, and a second gallium nitride based semiconductor region 17. The light-emitting layer 15 includes an active layer 19, and the active layer 19 includes a well layer 21 and a barrier layer 23, which are alternately arranged. The light-emitting layer 15 is provided between the first gallium nitride based semiconductor region 13 and the second gallium nitride based semiconductor region 17. The first gallium nitride based semiconductor region 13 can include one or more n-type gallium nitride based semiconductor layers (in the present embodiment, gallium nitride based semiconductor layers 25, 27, and 29). The second gallium nitride based semiconductor region 17 includes a gallium nitride based semiconductor layer 31 having a band gap larger than that of the barrier layer, and also includes one or more p-type gallium nitride based semiconductor layers (in the present embodiment, gallium nitride based semiconductor layers 33 and 35).

In the nitride based semiconductor optical device LE1, the well layer 21 extends along a reference plane SR1 tilting at a tilt angle α with respect to the plane that is orthogonal to a reference axis (shown by vector VC1), which extends in the c-axis direction. The tilt angle α can be in the range of 59 degrees to less than 80 degrees. Alternatively, the tilt angle α can be in the range of greater than 150 degrees to less than 180 degrees. The well layer 21 is strained, and the piezoelectric field of the well layer 21 includes a component of the direction that is opposite to the direction from the second gallium nitride based semiconductor region 17 toward the first gallium nitride based semiconductor region 13. The gallium nitride based semiconductor layer 31 of the second gallium nitride based semiconductor region 17 is adjacent to the light-emitting layer 15. The well layer 21 may be composed of a hexagonal gallium nitride based semiconductor, for example, a gallium nitride based semiconductor containing indium, such as InGaN. The barrier layer 23 may be composed of a gallium nitride semiconductor, for example, GaN, InGaN, AlGaN, or AlGaInN.

In this nitride based semiconductor optical device LE1, since each of the well layer 21 and the barrier layer 23 extends along the reference plane SR1 tilting at a tilt angle α within the above-mentioned range, the piezoelectric field in the well layer 21 includes a component of the direction (positive direction of the Z-axis) that is opposite to the direction from the second gallium nitride based semiconductor region 17 toward the first gallium nitride based semiconductor region 13, whereas the piezoelectric field in the gallium nitride based semiconductor layer 31 of the second gallium nitride based semiconductor region 17 includes a component of the direction (negative direction of the Z-axis) that is the same as the direction from the second gallium nitride based semiconductor region 17 toward the first gallium nitride based semiconductor region 13. Since the gallium nitride based semiconductor layer 31 is adjacent to the light-emitting layer 15, a dip is formed in a valence band, not in a conduction band, at the interface J1 between the gallium nitride based semiconductor layer 31 and the light-emitting layer 15. Such a dip not in the conduction band but in the valence band can reduce overflow of electrons.

The gallium nitride based semiconductor layer 31 of the second gallium nitride based semiconductor region 17 includes either an electron blocking layer or a cladding layer. The electron blocking layer blocks electrons from the active layer, and the cladding layer confines carries and light. The gallium nitride based semiconductor layer 31 of the second gallium nitride based semiconductor region 17 can be composed of, for example, p-type AlGaN.

Since the lattice constants in the a-axis and c-axis directions of InN are larger than those in the a-axis and c-axis directions of GaN, respectively, the well layer 21 of, for example, InGaN incorporates internal strain due to stress (compressive stress) from the barrier layer.

The tilt angle α can be in the range of 62 degrees to less than 80 degrees. This nitride based semiconductor optical device can reduce the blue shift. Alternatively, the tilt angle α can be in the range of greater than 150 degrees to 170 degrees. This nitride based semiconductor optical device can reduce the blue shift.

Figure 2:
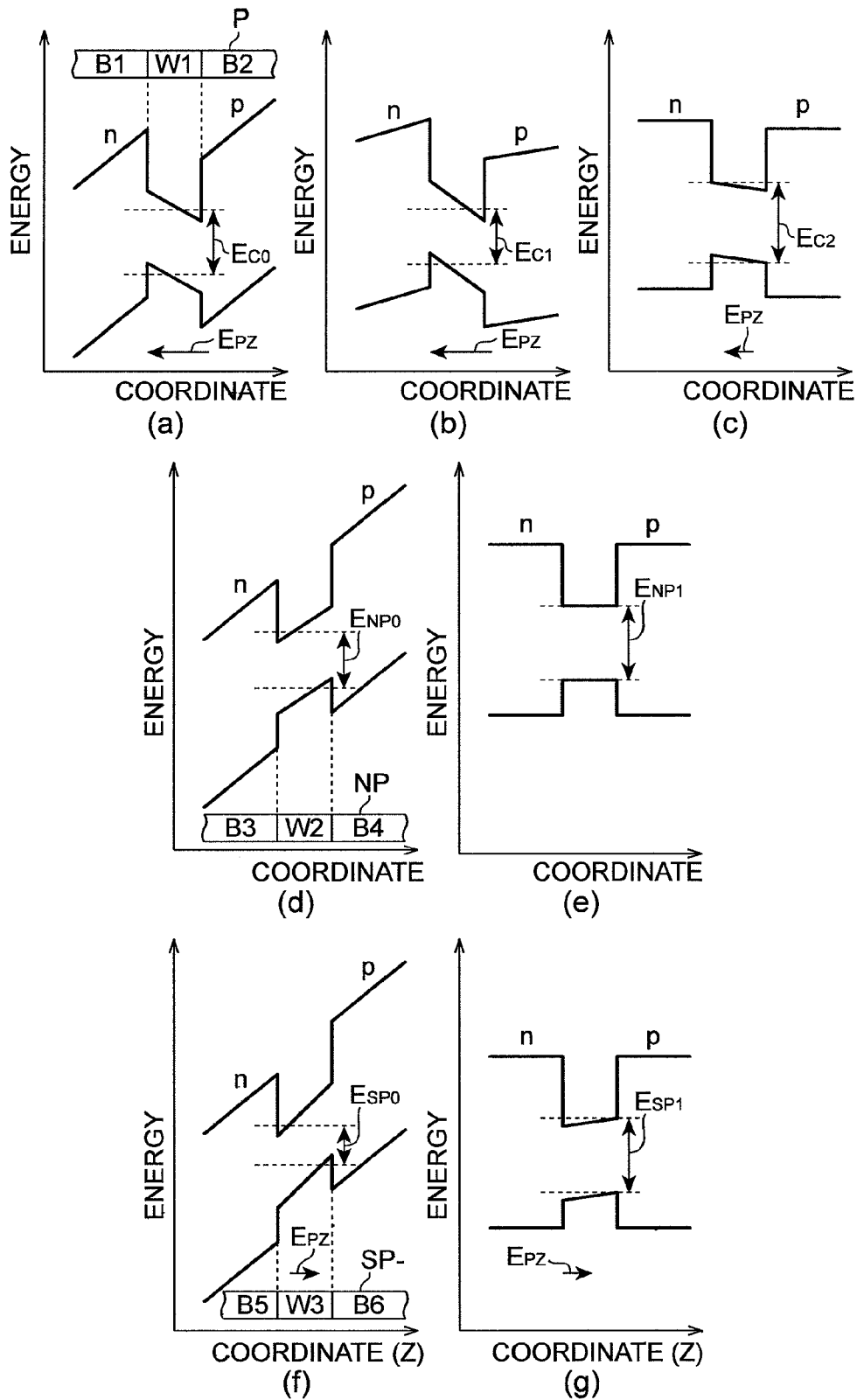
FIG. 2 is a view illustrating the directions of piezoelectric fields in strained light-emitting layers.

FIG. 2 shows illustrations strained light-emitting layers and the directions of piezoelectric fields therein. Parts (a) to (c) of FIG. 2 are views illustrating piezoelectric fields in light-emitting layers formed on a polar plane (c-plane). Parts (d) and (e) of FIG. 2 are views illustrating piezoelectric fields in light-emitting layers formed on a nonpolar plane (a-plane, m-plane). Parts (f) and (g) of FIG. 2 are views illustrating piezoelectric fields in light-emitting layers formed on a semipolar plane.

With respect to part (a) of FIG. 2, the light-emitting layer P includes barrier layers B1 and B2 and a well layer W1 which are formed on the polar plane (c-plane). The well layer W1 is provided between the barrier layers B1 and B2. The piezoelectric field $E_{PZ}$ in the well layer W1 is oriented in the direction from the p-type layer to the n-type layer. In the well layer, the band bottom of the conduction band and the band bottom of the valence electrons descend in the direction from the n-type layer toward the p-type layer. The reference symbol $E_{C0}$ denotes an energy difference between the band bottom of the conduction band and the band bottom of the valence band. With respect to part (b) of FIG. 2, a low forward-biased voltage is applied to the light-emitting layer P. This voltage application increases the tilts of the band bottom of the conduction band and the band bottom of the valence band in this light-emitting layer P. The reference symbol $E_{C1}$ denotes an energy difference between the band bottom of the conduction band and the band bottom of the valence band. The energy difference $E_{C0}$ is larger than the energy difference $E_{C1}$. With respect to part (c) of FIG. 2, a forward-biased high voltage is applied to the light-emitting layer P. In this voltage application, the tilts of the band bottom of the conduction band and the band bottom of the valence band decrease due to screening in this light-emitting layer P. The reference symbol $E_{C2}$ denotes an energy difference between the band bottom of the conduction band and the band bottom of the valence band. The energy difference $E_{C2}$ is larger than the energy difference $E_{C0}$. Change in the energy difference caused by the application of voltage leads to a blue shift.

As shown in part (d) of FIG. 2, the light-emitting layer NP includes barrier layers B3 and B4 and a well layer W2, which are formed on the nonpolar plane (a-plane, m-plane). The well layer W2 is provided between the barrier layers B3 and B4. Since the well layer W2 is grown on a nonpolar plane, the piezoelectric field $E_{PZ}$ is zero. In the well layer W2, the band bottom of the conduction band and the band bottom of the valence band descend in the direction from the p-type layer toward the n-type layer. The reference symbol $E_{NP0}$ denotes an energy difference between the band bottom of the conduction band and the band bottom of the valence band. With respect to part (e) of FIG. 2, a forward-biased voltage is applied to the light-emitting layer NP. In this light-emitting layer NP, the tilts of the band bottom of the conduction band and the band bottom of the valence band are almost cancelled by this voltage application. The reference symbol $E_{NP1}$ denotes an energy difference between the band bottom of the conduction band and the band bottom of the valence electrons. The energy difference $E_{NP0}$ is smaller than the energy difference $E_{NP1}$. Since the piezoelectric field is zero in the light-emitting layer NP, screening does not occur even if the amount of carriers in the well layer increases. Accordingly, the application of voltage does not cause any change in the energy difference, so that no blue shift is observed.

With respect to part (f) of FIG. 2, the light-emitting layer SP-includes barrier layers B5 and B6 and a well layer W3, which are formed on a semipolar plane tilting at a specific off-angle. The well layer W3 is provided between the barrier layers B5 and B6. Since the well layer W3 is formed on a semipolar plane, the piezoelectric field $E_{PZ}$ is smaller than that on a polar plane. In the well layer W3, the band bottom of the conduction band and the band bottom of the valence band descend in the direction from the p-type layer toward the n-type layer. The reference symbol $E_{SP0}$ denotes an energy difference between the band bottom of the conduction band and the band bottom of the valence band. With reference to part (g) of FIG. 2, a forward-biased voltage is applied to the light-emitting layer SP−. In this light-emitting layer SP−, the application of the above voltage decreases the tilts of the band bottom of the conduction band and the band bottom of the valence band. The reference symbol $E_{NP1}$ denotes an energy difference between the band bottom of the conduction band and the band bottom of the valence band, and the energy difference $E_{SP0}$ is larger than the energy difference $E_{SP1}$. Since the piezoelectric field in the light-emitting layer SP− includes a component of the direction that is opposite to the direction from the p-type layer to the n-type layer, no screening occurs. Therefore, the application of voltage causes a small change in the energy difference, so that the blue shift is very small.

The well layer (light-emitting layer SP−) of plane orientation of the tilt angle range in the present embodiment acts as shown in parts (f) and (g) of FIG. 2. But, the well layer (light-emitting layer SP+) on a semipolar plane which is different from the plane orientation in the tilt angle range according to the present embodiment acts as shown in parts (a) to (c) of FIG. 2.

Figure 3:
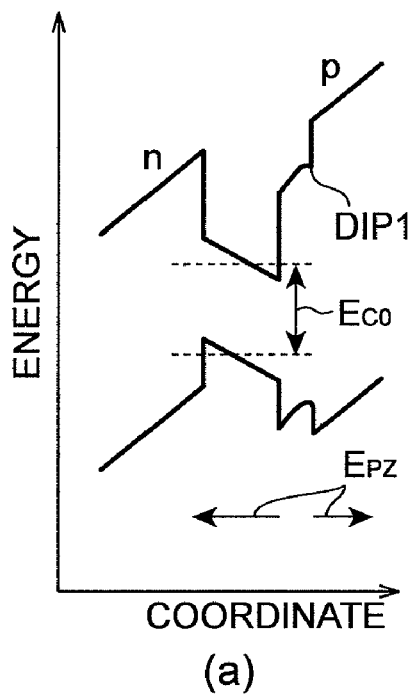
FIG. 3 is a view illustrating the directions of piezoelectric fields in strained light-emitting layers.
Figure 3:
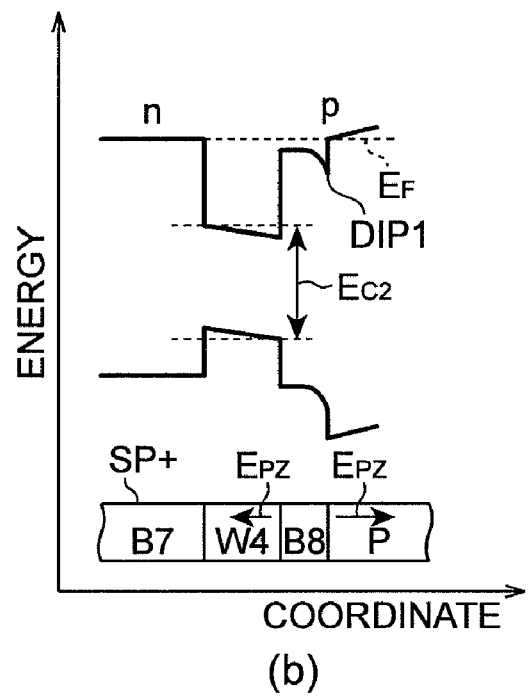
Figure 3:
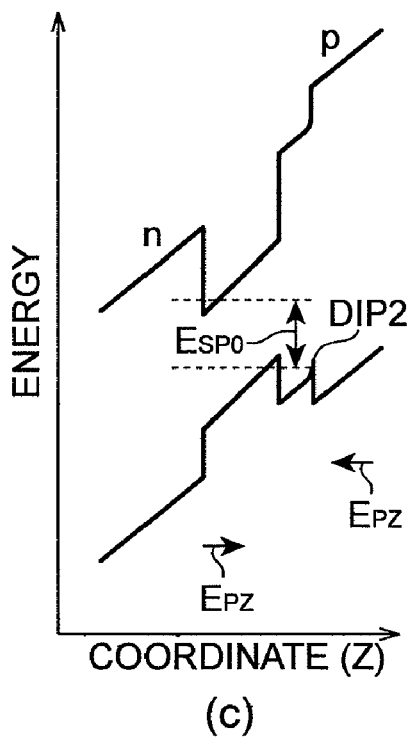
Figure 3:
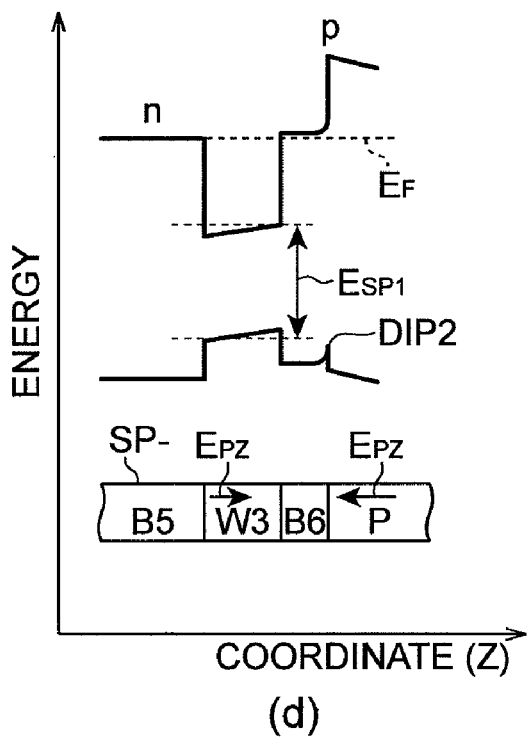

Next, the light-emitting layer formed on a semipolar plane will be further described below. FIG. 3 includes views illustrating strained light-emitting layers and the directions of piezoelectric fields therein. Parts (a) and (b) of FIG. 3 show light-emitting layers SP+ incorporating positive piezoelectric fields. The light-emitting layer SP+ includes barrier layers B7 and B8 and a well layer W4. The well layer W4 is provided between the barrier layers B7 and B8. A gallium nitride based semiconductor layer P, adjacent to the light-emitting layer SP+, is shown which has a band gap larger than that of the barrier layer. The gallium nitride based semiconductor layer P can be, for example, a p-type electron blocking layer or a p-type cladding layer. The direction of the piezoelectric field in the well layer W4 is from the p-type layer toward the n-type layer, whereas the direction of the piezoelectric field in the gallium nitride based semiconductor layer P is from the n-type layer to the p-type layer. The conduction band therefore has a dip DIP1 at the interface between the light-emitting layer SP+ and the gallium nitride based semiconductor layer P. This DIP1 reduces the electronic barrier in the gallium nitride based semiconductor layer P. The height of dip DIP1 is, for example, about 0.2 eV.

Parts (c) and (d) of FIG. 3 show a light-emitting layer SP− having a negative piezoelectric field, and in the figure, the gallium nitride based semiconductor layer P having a band gap larger than those of the barrier layers is adjacent to the light-emitting layer SP−. The direction of the piezoelectric field in the well layer W3 is from the n-type layer toward the p-type layer, whereas the direction of the piezoelectric field in the gallium nitride based semiconductor layer P is from the p-type layer toward the n-type layer. Accordingly, a dip is formed in the valence band, not the conduction band at the interface between the light-emitting layer SP− and the gallium nitride based semiconductor layer P. Consequently, the dip DIP2 of the conduction band does not lower the barrier to electrons flowing in the light-emitting layer, and, therefore, the gallium nitride based semiconductor layer P can work as a sufficient blocker to the electrons in the light-emitting layer. The height of the dip DIP2 is, for example, about 0.1 eV.

Referring to FIG. 1 again, the semiconductor light-emitting device LE1 will be described below. The n-type gallium nitride based semiconductor layer 25 in the first gallium nitride based semiconductor region 13 can be a Si-doped n-type AlGaN buffer layer having a thickness of, for example, 50 nanometers. The n-type gallium nitride based semiconductor layer 27 can be a Si-doped n-type GaN layer having a thickness of, for example, 2000 nanometers. The n-type gallium nitride based semiconductor layer 29 can be a Si-doped n-type InGaN buffer layer, and the indium fraction thereof is, for example, 0.02. The thickness of the n-type gallium nitride based semiconductor layer 29 can be, for example, 100 nanometers.

The p-type gallium nitride based semiconductor layer 31 of the second gallium nitride based semiconductor region 17 is, for example, a Mg-doped p-type AlGaN layer, and its fraction of aluminum is, for example, 0.07. The thickness of the p-type gallium nitride based semiconductor layer 31 is, for example, 20 nanometers. The p-type gallium nitride based semiconductor layer 33 can be a Mg-doped p-type GaN layer, and its thickness is, for example, 25 nanometers. The p-type gallium nitride semiconductor layer 35 can be a Mg-doped $p^+$-type GaN contact layer, and its thickness is, for example, 25 nanometers.

An undoped GaN layer 37 having a thickness of, for example, 15 nanometers is grown on the active layer 19.

An electrode is formed above the semiconductor layers (13, 15, and 17). A first electrode (for example, anode) 41a is formed on the contact layer 35, and a second electrode (for example, cathode) 41b is formed on the back side 11b of the substrate. Light L is generated in response to the injection of carriers into active layer 19 via these electrodes. Since the piezoelectric field in the active layer 19 is small, light from the active layer 19a can exhibit small blue shift. In addition, since the conduction band does not have a dip at the interface between the light-emitting layer 19 and the gallium nitride based semiconductor 31, the light-emitting device LE1 can exhibit enhanced the confinement of electron.

The nitride based semiconductor optical device LE1 may be further provided with a substrate 11. The substrate 11 is made of a hexagonal semiconductor $In_SAl_TGa_{1-S-T}N$ ($0 \leq S \leq 1$, $0 \leq T \leq 1$, $0 \leq S+T \leq 1$), such as GaN, InGaN, or AlGaN. The primary surface 11a of the substrate 11 extends along a plane tilting at a tilt angle β in the range of 59 degrees to less than 80 degrees or greater than 150 degrees to less than 180 degrees with reference to the plane that is orthogonal to the c-axis (for example, shown by vector VC2) of the hexagonal semiconductor. The tilt angle β is substantially equal to the tilt angle α, as long as a slight tilt of the crystal axis due to strain in the light-emitting layer 15 is neglected. Furthermore, the direction of the vector VC2 is substantially equal to that of the vector VC1, as long as a slight tilt of the crystal axis due to strain in the light-emitting layer 15 is neglected.

The first gallium nitride based semiconductor region 13, the light-emitting layer 15, and the second gallium nitride based semiconductor region 17 are arranged in the direction of a predetermined axis Ax (for example, the direction of the Z-axis) on the primary surface 11a of the substrate 11. The direction of the predetermined axis Ax is different from the direction of the c-axis of the substrate 11.

The use of this substrate 11 facilitates to provide the light-emitting layer 15 with plane orientation for the well layer such that the piezoelectric field in the well layer 21 includes a component of a direction that is opposite to the direction from the second gallium nitride based semiconductor region 17 toward the first gallium nitride based semiconductor region 13.

Figure 4:
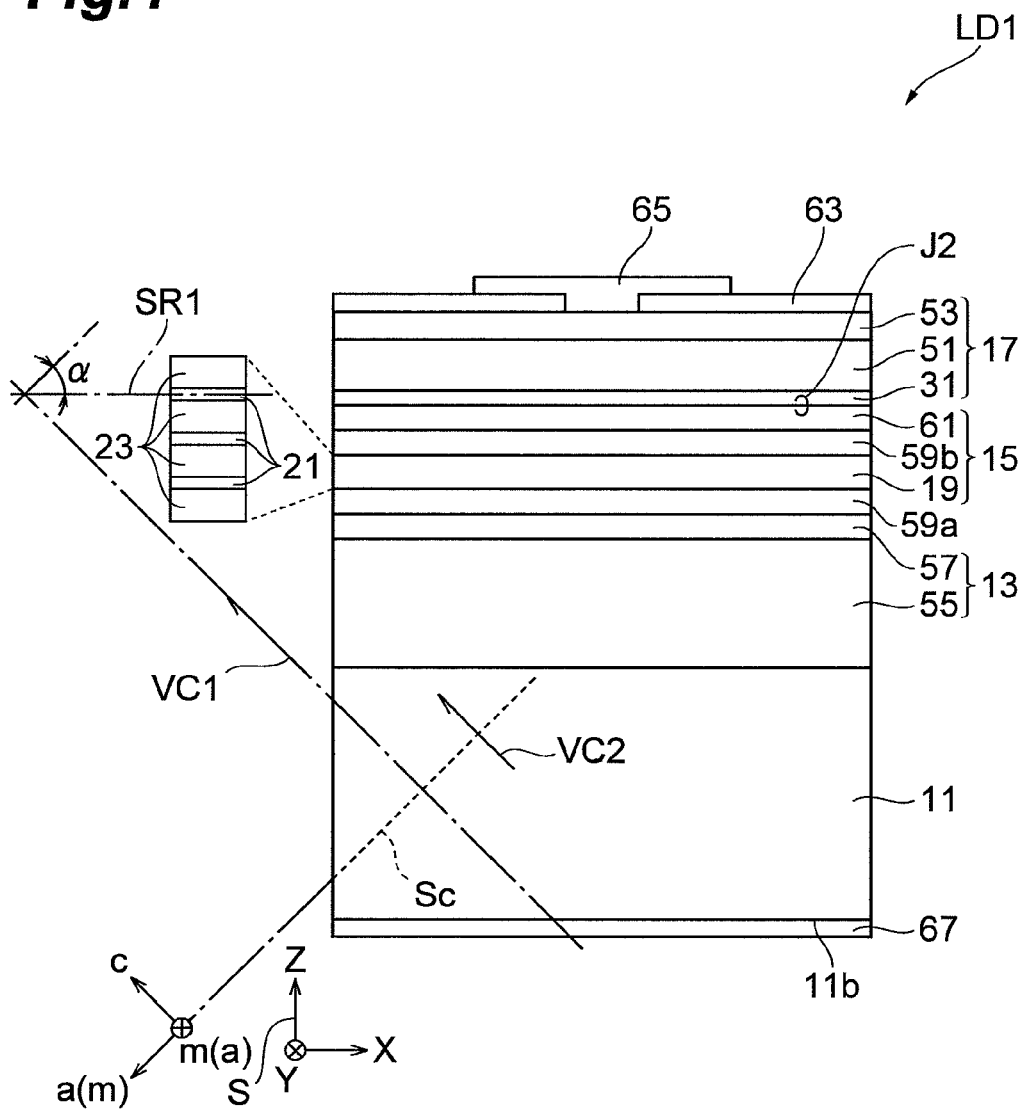
FIG. 4 is a schematic diagram showing the structure of a nitride based semiconductor optical device according to an embodiment of the present invention.

FIG. 4 is a diagram schematically showing the structure of a nitride based semiconductor optical device according to an embodiment. The nitride based semiconductor optical device LD1 is, for example, a semiconductor laser. FIG. 4 shows a coordinate system S. The primary surface 13a of a substrate 13 is directed to the Z-axis, and extends in the X and Y directions. The Y-axis is orientated in the direction of the m-axis.

The nitride based semiconductor optical device LD1 has a structure suitable for a semiconductor laser, and includes a first gallium nitride based semiconductor region 13, a light-emitting region 15, and a second gallium nitride based semiconductor region 17. The light-emitting layer 15 includes an active layer 19, and the active layer 19 has a quantum-well structure that includes a well layer 21 and a barrier layer 23, which are alternately arranged. The light-emitting layer 15 is provided between the first gallium nitride based semiconductor region 13 and the second gallium nitride based semiconductor region 17. The first gallium nitride based semiconductor region 13 may include one or more n-type gallium nitride based semiconductor layers (in this embodiment, gallium nitride based semiconductor layers 55 and 57). The second gallium nitride based semiconductor region 17 includes a gallium nitride based semiconductor layer 31 of a band gap larger than that of the barrier layers, and one or more p-type gallium nitride based semiconductor layers (in this embodiment, gallium nitride based semiconductor layers 51 and 53).

In the nitride based semiconductor optical device LD1, each well layer 21 extends along a reference plane SR1 tilting at a tilt angle α with respect to the plane that is orthogonal to a reference axis (shown by vector VC1) extending in the direction of the c-axis. The tilt angle α may be in the range of 59 degrees to less than 80 degrees. Alternatively, the tilt angle α may be in the range of greater than 150 degrees to less than 180 degrees. The well layers 21 have internal strain, and the piezoelectric fields in the strained well layers 21 include components in the direction that is opposite to the direction from the second gallium nitride based semiconductor region 17 toward the first gallium nitride based semiconductor region 13. The gallium nitride based semiconductor layer 31 of the second gallium nitride based semiconductor region 17 is adjacent to the light-emitting layer 15.

In this nitride based semiconductor optical device LD1, since each of the well layers 21 and the barrier layers 23 extends along the reference plane SR1 tilting at a tilt angle α within the above-mentioned angle range, the piezoelectric field in the well layers 21 includes a component in the direction (positive direction of the Z-axis) that is opposite to the direction from the second gallium nitride based semiconductor region 17 toward the first gallium nitride based semiconductor region 13. On the other hand, the piezoelectric field in this gallium nitride based semiconductor layer 31 includes a component in the direction (negative direction of the Z-axis) that is the same as the direction from the second gallium nitride based semiconductor region 17 toward the first gallium nitride based semiconductor region 13. The gallium nitride based semiconductor layer 31 of the second gallium nitride based semiconductor region 17 is adjacent to the light-emitting layer 15, and thus, the valence band, not the conduction band, has a dip at the interface J2 between the gallium nitride based semiconductor layer 31 and the light-emitting layer 15. The dip thus generated in the valence band, not in the conduction band, leads to a reduction in overflow of electrons.

In the semiconductor light-emitting device LD1, the n-type gallium nitride based semiconductor layer 55 in the first gallium nitride based semiconductor region 13 can be, for example, a Si-doped n-type AlGaN cladding layer, its thickness can be, for example, 2300 nanometers and its fraction of aluminum can be, for example, 0.04. The n-type gallium nitride based semiconductor layer 55 can be, for example, a Si-doped n-type GaN layer, and its thickness can be, for example, 50 nanometers. The light-emitting layer 15 may include first and second optical guide layers 59a and 59b. The active layer 19 is provided between the optical guide layers 59a and 59b. The optical guide layers 59a and 59b may be composed of, for example, undoped InGaN, and its fraction of indium can be, for example, 0.06 and its thickness can be, for example, 100 nanometers.

The p-type gallium nitride based semiconductor layer 31 of the second gallium nitride based semiconductor region 17 can be, for example, a Mg-doped p-type AlGaN layer, its fraction of aluminum can be, for example, 0.18 and its thickness can be, for example, 20 nanometers. The p-type gallium nitride based semiconductor layer 51 is a Mg-doped p-type AlGaN cladding layer, and its fraction of aluminum can be, for example, 0.06. The thickness of p-type gallium nitride based semiconductor layer 51 can be, for example, 400 nanometers. The p-type gallium nitride based semiconductor layer 53 can be a Mg-doped p+-type GaN contact layer, and its thickness can be, for example, 50 nanometers.

An undoped GaN layer 61 having a thickness of, for example, 50 nanometers is grown on the active layer 19. An insulating film 63 having a stripe window is formed above the semiconductor layers (13, 15, 17), and an electrode is formed on the insulating film 63 and the semiconductor layers (13, 15, 17). A first electrode (for example, anode) 65 is formed on the contact layer 53, and a second electrode (for example, cathode) 67 is formed on the back side 13b of the substrate. The active layer 19 generates laser beam in response to the injection of carriers via these electrodes. Since the piezoelectric field in the active layer 19 is small, the blue shift can be also small. In addition, since the conduction band does not have any dip at the interface between the light-emitting layer 19 and the gallium nitride semiconductor 31, the light-emitting device LD1 can exhibit enhanced confinement of electron.

In the nitride based semiconductor optical devices LE1 and LD1, the reference plane SR1 may tilt toward the direction of the a-axis. The tilt toward the direction of the a-axis enables the cleavage of the m-plane. In addition, the reference plane SR1 may tilt toward the direction of the m-axis. The tilt toward the direction of the m-axis enables the cleavage of the a-plane.

Figure 5:
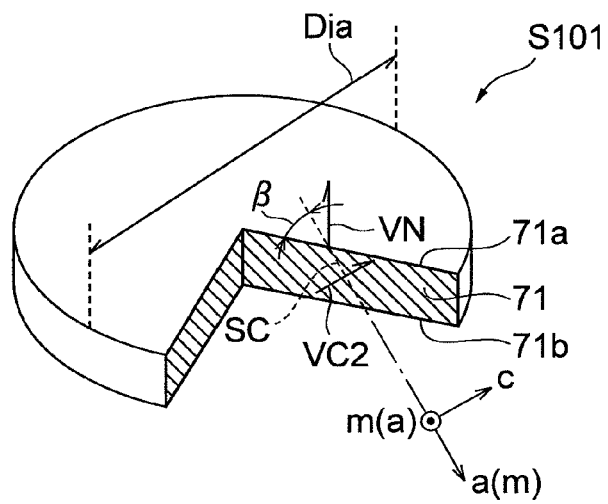
FIG. 5 is a view showing primary steps in the methods of fabricating a nitride based semiconductor optical device according to an embodiment and an epitaxial wafer.
Figure 5:
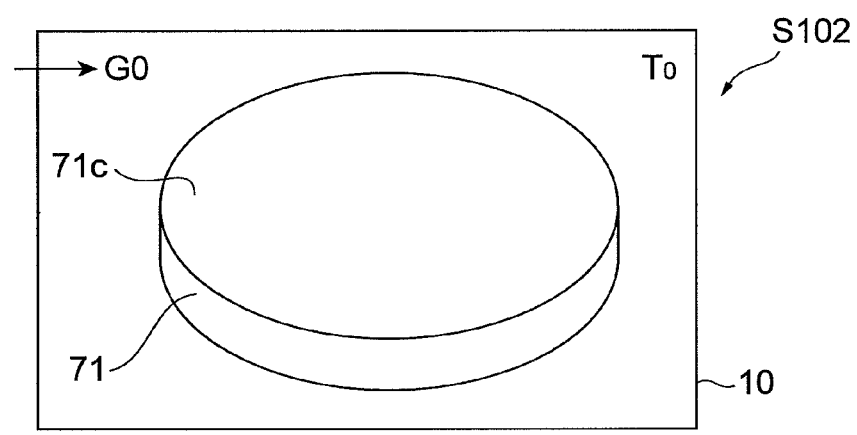
Figure 5:
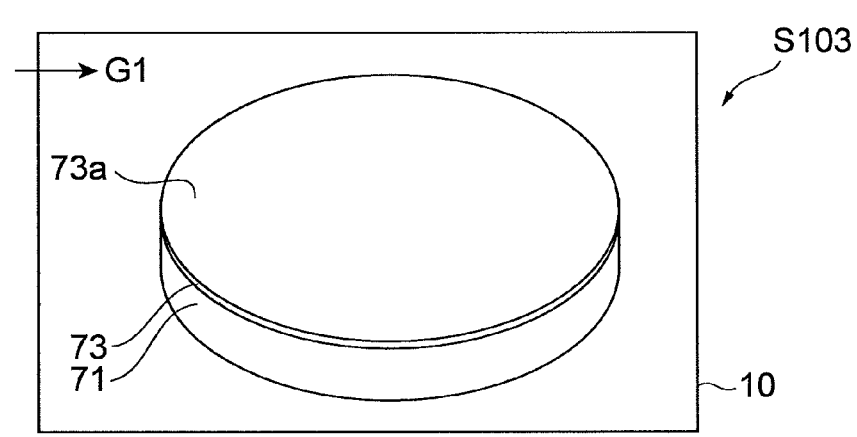
Figure 6:
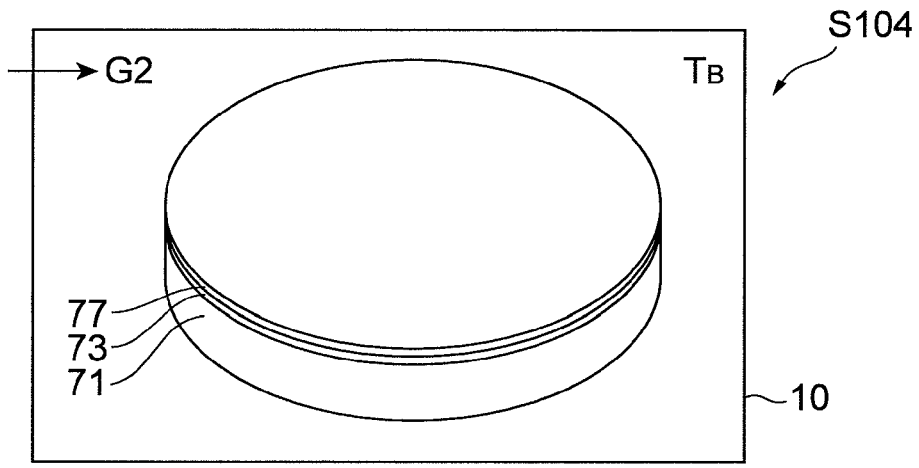
FIG. 6 is a view showing primary steps in the methods of fabricating a nitride based semiconductor optical device according to an embodiment and an epitaxial wafer.
Figure 6:
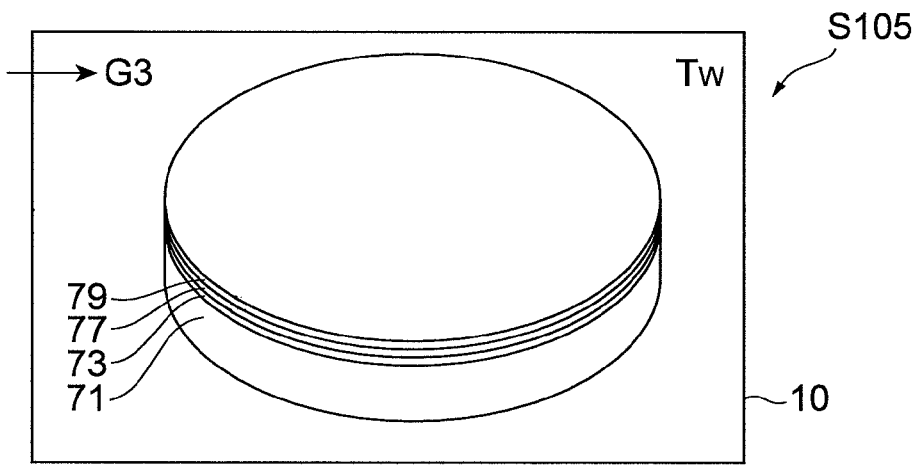
Figure 6:
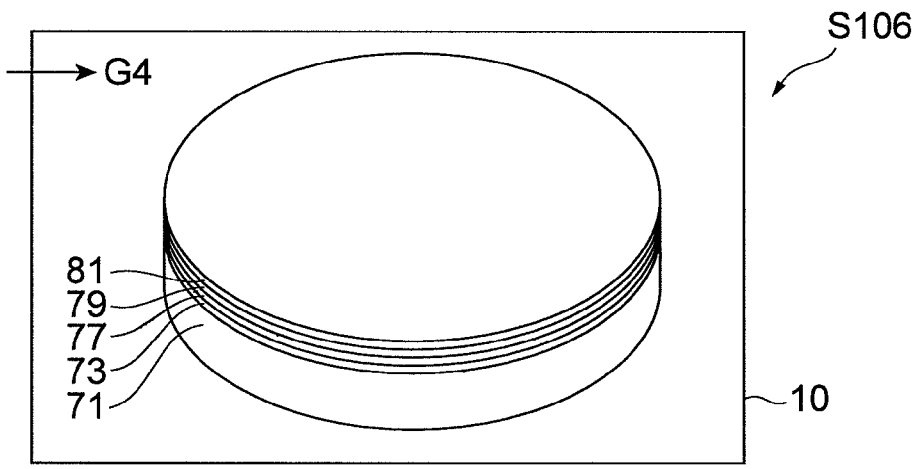
Figure 7:
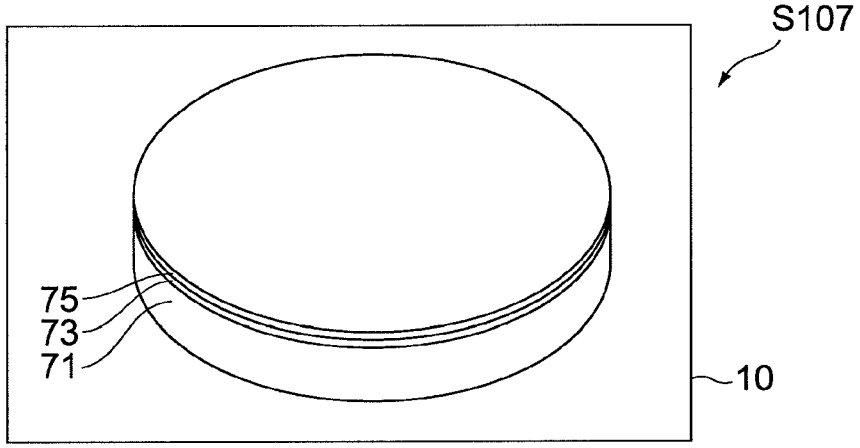
FIG. 7 is a view showing primary steps in the methods of fabricating a nitride based semiconductor optical device according to an embodiment and an epitaxial wafer.
Figure 7:
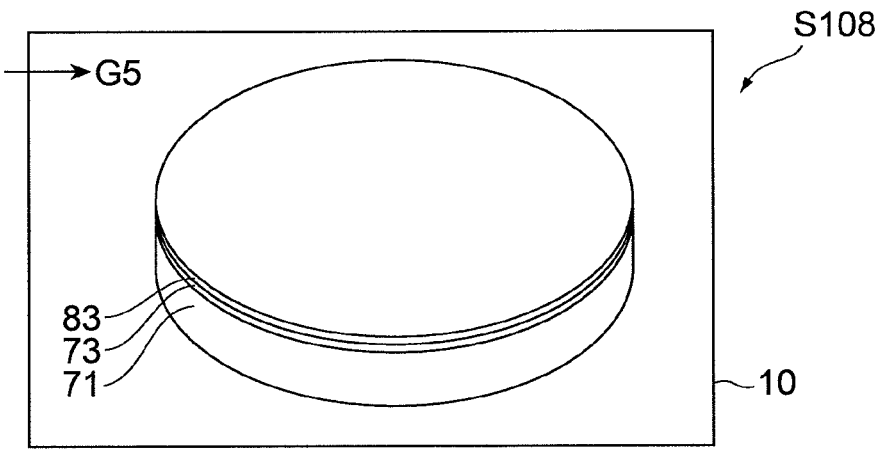
Figure 7:
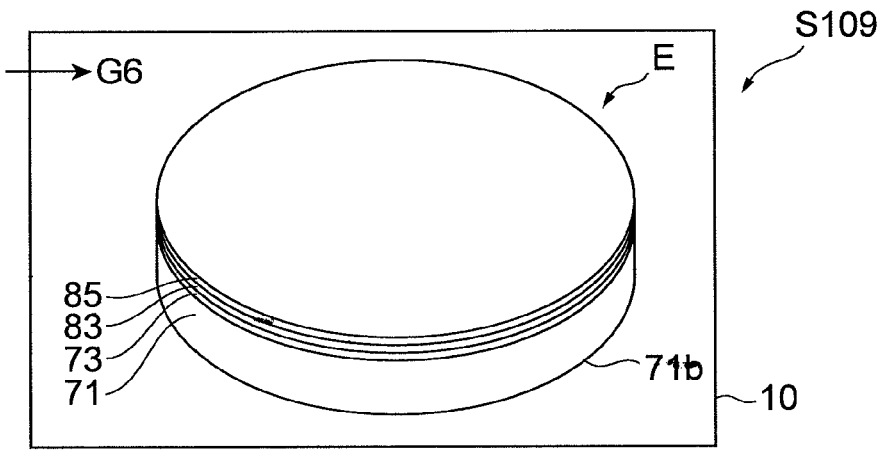

FIGS. 5 to 7 include diagrams showing primary steps in a method of fabricating a nitride based semiconductor optical device according to an embodiment, and in the method of fabricating an epitaxial wafer for this optical device. As shown in part (a) of FIG. 5, in step S101, a substrate 71 for forming a nitride based semiconductor optical device and an epitaxial wafer is prepared. The substrate 71 can be made of, for example, a hexagonal semiconductor $In_SAl_TGa_{1-S-T}N$ ($0 \leq S \leq 1$, $0 \leq T \leq 1$, $0 \leq S+T \leq 1$) and includes a primary surface 71a and a back surface 71b. With reference to part (a) of FIG. 5, the vector VC indicates the direction of the c-axis of the hexagonal semiconductor substrate 71, and the vector VN indicating a line normal to the primary surface 71a. The vector VC2 indicates the direction of a {0001} plane. This substrate 71 can provide the primary surface with semipolar of a tilt angle (off angle) β. The tilt angle of the primary surface 71a of the substrate 71 is in the range of greater than 59 degrees to less than 80 degrees or greater than 150 degrees to less than 180 degrees with reference to the {0001} plane of the hexagonal semiconductor. At a tilt angle of the primary surface 71a of 59 degrees to less than 80 degrees or of greater than 150 degrees to less than 180 degrees, the piezoelectric field in the well layer in the nitride based semiconductor optical device formed on the primary surface of the substrate 71 includes a component in a direction that is opposite to the direction from the second gallium nitride based semiconductor region toward the first gallium nitride based semiconductor region, and the piezoelectric field in the gallium nitride semiconductor layer of the second gallium nitride based semiconductor region includes a component in a direction that is the same as the direction from the second gallium nitride based semiconductor region toward the first gallium nitride based semiconductor region. Accordingly, a nitride based semiconductor optical device with enhanced electron confinement can be fabricated.

The maximum distance Dia between two points on the edge of the substrate 71 may be 45 millimeters or more. Such a substrate is called, for example, a wafer. The back side 11b of the substrate 71 may be substantially parallel to the front side of the substrate 71. In addition, when the substrate 71 is made of GaN, this GaN substrate enables epitaxial growth with high crystal quality.

In the subsequent step, semiconductor crystals is epitaxially grown on the primary surface 71a of the substrate 71 with an off angle selected such that a negative piezoelectric field is generated in the well layer. The substrate 71 having a primary surface 71a with the above-mentioned tilt angle can form an epitaxial semiconductor region such that the well layer in the active layer tilts from the c-plane within the above-mentioned angle range.

Regarding the tilt direction of the primary surface 71a of the substrate 71, when the primary surface 71a tilts toward the direction of the a-axis of the hexagonal semiconductor substrate 71, the epitaxial substrate formed on this substrate 71 can be cleaved along the m-plane. When the primary surface 71a of the substrate 71 tilts toward the direction of the m-axis of the hexagonal semiconductor substrate 71, the epitaxial substrate formed on the substrate 71 can be cleaved along the a-plane. Furthermore, when the primary surface 71a tilts toward the direction of the a-axis of the hexagonal semiconductor substrate 71, the off angle in the direction of the m-axis is preferably in the range of −3 degrees to +3 degrees. In addition, when the primary surface 71a tilts toward the direction of the m-axis of the hexagonal semiconductor substrate 71, the off angle in the direction of the a-axis is preferably in the range of −3 degrees to +3 degrees. When the laser cavity of the nitride based semiconductor optical device LD1 has ends that tilt within the above ranges, a decrease in reflectivity of the ends is made small, leading to a low oscillation threshold.

The substrate 71 is loaded into a reactor 10. As shown in part (b) of FIG. 5, in step S102, the substrate 71 is heat-treated while a gas G0 is supplied to the reactor 10, thereby forming a modified primary surface 71c prior to the growth. This heat treatment can be performed in a gas atmosphere containing ammonia and hydrogen. The heat treatment temperature $T_0$ may be in the range of, for example, from 800° C. to 1200° C. The heat treatment is carried out for, for example, about 10 minutes. After this step, a semipolar primary surface has a surface structure, which is different from that of the c-plane, formed because of the tilt of the primary surface 71a. The heat treatment of the primary surface 71a of the substrate 71 performed in advance of the growth results in modification of the semiconductor primary surface, which cannot be achieved by any c-plane primary surface. The epitaxially grown films of gallium nitride based semiconductor will be grown on the modified primary surface 71c of the substrate 71.

As shown in part (c) of FIG. 5, in step S103, after the heat treatment, a first conductivity-type gallium nitride based semiconductor region 73 is epitaxially grown on the surface 71c of the substrate 71. The crystal growth is performed by metal-organic chemical vapor deposition using a gallium source, an indium source, an aluminum source, and a nitrogen source, as raw material for semiconductor growth. The gallium source, the indium source, and the nitrogen source are, for example, TMG, TMI, TMA, and $NH_3$, respectively. For the above growth, a raw material gas G1 is supplied to the reactor 10. The primary surface 73a of the gallium nitride based semiconductor region 73 tilts from the c-plane of the gallium nitride based semiconductor in an angle of the range of 59 degrees to less than 80 degrees or the range of greater than 150 degrees to less than 180 degrees. The first conductivity-type gallium nitride based semiconductor region 73a may contain one or more gallium nitride based semiconductor layers (for example, gallium nitride based semiconductor layers 25, 27, and 29). For example, these gallium nitride based semiconductor layers 25, 27, and 29 may be an n-type AlGaN layer, an n-type GaN layer, and an n-type InGaN layer, respectively. The gallium nitride based semiconductor layers 25, 27, and 29 are epitaxially grown in sequence on the primary surface 71c of the substrate 71. The n-type AlGaN layer 25 is formed as, for example, an interlayer, which covers the entire surface of the substrate 71, and is grown, for example, at 1100° C. The thickness of the n-type AlGaN layer 25 is, for example, 50 nanometers. The n-type GaN layer 27 is grown on the n-type AlGaN layer 25 at 950° C. The n-type GaN layer 27 is provided for supplying n-type carriers, for example, and has a thickness of 2000 nanometers. The n-type InGaN layer 29 is grown on the n-type GaN layer 27 at 840° C. The n-type InGaN layer 29 provided for a buffer layer for the active layer, for example, and has a thickness of 100 nanometers.

In the next step, as shown in FIGS. 6 and 7, an active layer 75 of the nitride semiconductor light-emitting device is fabricated. The active layer 75 is provided so as to have a light-emitting spectrum having a peak wavelength in the wavelength region of 370 nanometers to 650 nanometers.

As shown in part (a) of FIG. 6, in step S104, a barrier layer 77 composed of a gallium nitride based semiconductor is formed for a quantum-well structure of the active layer 75. The barrier layer 77 is grown on the buffer layer at a growth temperature $T_B$ by supplying a raw material gas G2 into the reactor 10. The barrier layer 77 is composed of $In_YGa_{1-Y}N$ (indium composition Y: $0 \leq Y \leq 0.05$, where Y denotes the strained composition). The barrier layer 77 is formed at a growth temperature $T_B$ in the range, for example, of 700° C. to 1000° C. In this embodiment, a raw material gas G2 containing a gallium source and a nitrogen source is supplied to the reactor 10 to grow undoped GaN at a growth temperature $T_B$. The thickness of the GaN barrier layer is, for example, 15 nanometers. Since the barrier layer 77 is grown on the primary surface 73a, the surface of the barrier layer 77 has the same surface structure as that of the primary surface 73a.

After the completion of the growth of the barrier layer 77, the supply of the gallium source is stopped to terminate the growth of the gallium nitride based semiconductor. After the growth of the barrier layer 77 and before the growth of a well layer, the temperature of the reactor is changed from the growth temperature $T_B$ to a growth temperature $T_W$. During this period of time for changing the temperature, a nitrogen source gas, such as ammonia, is supplied into the reactor 10.

As shown in part (b) of FIG. 6, in step S105, a well layer 79 for the quantum-well structure is grown on the barrier layer 77, while the temperature of the reactor 10 is maintained at a well-layer growth temperature $T_W$. The well layer 79 is composed of a gallium nitride based semiconductor containing indium, such as $In_XGa_{1-X}N$ (indium composition X: 0<X<1, X denotes strained composition), and has a band gap energy smaller than that of the barrier layer 77. The growth temperature $T_W$ for the well layer 79 is lower than the growth temperature $T_B$. In this example, a raw material gas G3 containing a gallium source, an indium source, and a nitrogen source is supplied to the reactor 10 to grow undoped InGaN. The well layer 79 may have a thickness of 1 to 10 nanometers. In addition, the indium composition X of the $In_XGa_{1-X}N$ well layer 79 may be greater than 0.05. The indium composition of $In_XGa_{1-X}N$ in the well layer 79 may be less than 0.5. InGaN having an indium composition in the above range can be grown to form a light-emitting device with a emitting wavelength of 370 to 650 nanometers. The well layer 79 is grown at a growth temperature $T_W$ within the range of, for example, 600° C. to 900° C. The thickness of the InGaN well layer is, for example, 3 nanometers. Since the primary surface of the well layer 79 is epitaxially grown on the primary surface of the barrier layer 77, the surface of the well layer 79 has the same surface structure as that of the barrier layer 77, and tilts from the c-plane of the gallium nitride based semiconductor by a predetermined angle in association with the tilt angle of the primary surface of the barrier layer 77.

After the growth of the well layer 79 and before the growth of another barrier layer, the temperature of the reactor 10 is changed from the growth temperature $T_W$ to the growth temperature $T_B$. During this period of time for changing the temperature, a nitrogen source gas, such as ammonia, is supplied into the reactor 10. After the completion of the heating of the reactor 10, in step S106, as shown in part (c) of FIG. 6, a barrier layer 81 composed of a gallium nitride based semiconductor is grown while a raw material gas G4 is fed into the reactor 10 in which the growth temperature $T_B$ is maintained. In this example, the barrier layer 81 is composed of, for example, GaN, and has a thickness of, for example, 15 nanometers. Since the primary surface of the barrier layer 81 is epitaxially grown on the primary surface of the well layer 79, and accordingly, the surface of the barrier layer 81 has the same surface structure as that of the well layer 79.

In step S107, similar growth is repeatedly performed to complete an active layer 75 having a quantum-well structure, as shown in part (a) of FIG. 7. The active layer 75 includes three well layers 79 and four barrier layers 77 and 81. Then, as shown in part (b) of FIG. 7, in step S108, a light-emitting layer 83 is formed by growing a necessary semiconductor layer(s) by supplying a raw material gas G5. The band gap of the semiconductor layer in the light-emitting layer 83, which is provided between the active layer 75 and a second conductivity-type gallium nitride based semiconductor region 85, is smaller than that of the gallium nitride based semiconductor layer, which is in contact with the light-emitting layer 83, of the second conductivity-type gallium nitride based semiconductor region 85.

As shown in part (c) of FIG. 7, in step S109, the second conductivity-type gallium nitride based semiconductor region 85 is epitaxially grown on the light-emitting layer 83 by supplying a raw material gas G6 in the reactor 10. The second conductivity-type gallium nitride based semiconductor region 85 may include, for example, an electron blocking layer 31, a first p-type contact layer 33, and a second p-type contact layer 35. The electron blocking layer 31 may be composed of, for example, AlGaN, and the p-type contact layers 33 and 35 may be composed of p-type GaN. The dopant concentration $N_{37}$ of the second p-type contact layer 35 is larger than the dopant concentration $N_{35}$ of the first p-type contact layer 33. In this example, the growth temperature of the electron blocking layer 31 and the p-type contact layers 33 and 35 is, for example, 1100° C. The second conductivity-type gallium nitride based semiconductor region 31 is formed to complete an epitaxial wafer E, which is shown in part (c) of FIG. 7. If necessary, a pair of optical guide layers for optical guiding in a semiconductor laser may be grown. These optical guide layers sandwich the active layer, and may be composed of, for example, InGaN or GaN.

In the epitaxial wafer E, the first conductivity-type gallium nitride based semiconductor region 73, the light-emitting layer 83, and the second conductivity-type gallium nitride based semiconductor layer 85 may be arranged in the axial direction normal to the primary surface 71a of the substrate 71. The direction of the c-axis of the hexagonal semiconductor is different from the direction of the axis that is normal to the primary surface 71a of the substrate 71. The direction of the epitaxial growth is the direction of the c-axis, and is different from the direction in which the semiconductor layers 73, 83, and 85 are laminated.

In the next step, electrodes are formed on the epitaxial wafer E. A first electrode (for example, anode) is formed on the contact layer 35, and a second electrode (for example, cathode) is formed on the back side 71b of the substrate.

After the formation of the electrodes, end faces for an optical cavity may be created by cleavage. That is, a semiconductor laser can be produced which utilizes these end faces for an optical cavity formed by cleavage. When the primary surface 71a of the substrate 71 tilts toward the direction of the a-axis of the gallium nitride based semiconductor, the m-plane can be used as a cleavage plane. When the primary surface 71a of the substrate 71 tilts toward the direction of the m-axis of the gallium nitride based semiconductor, the a-plane can be used as a cleavage plane.

Figure 8:
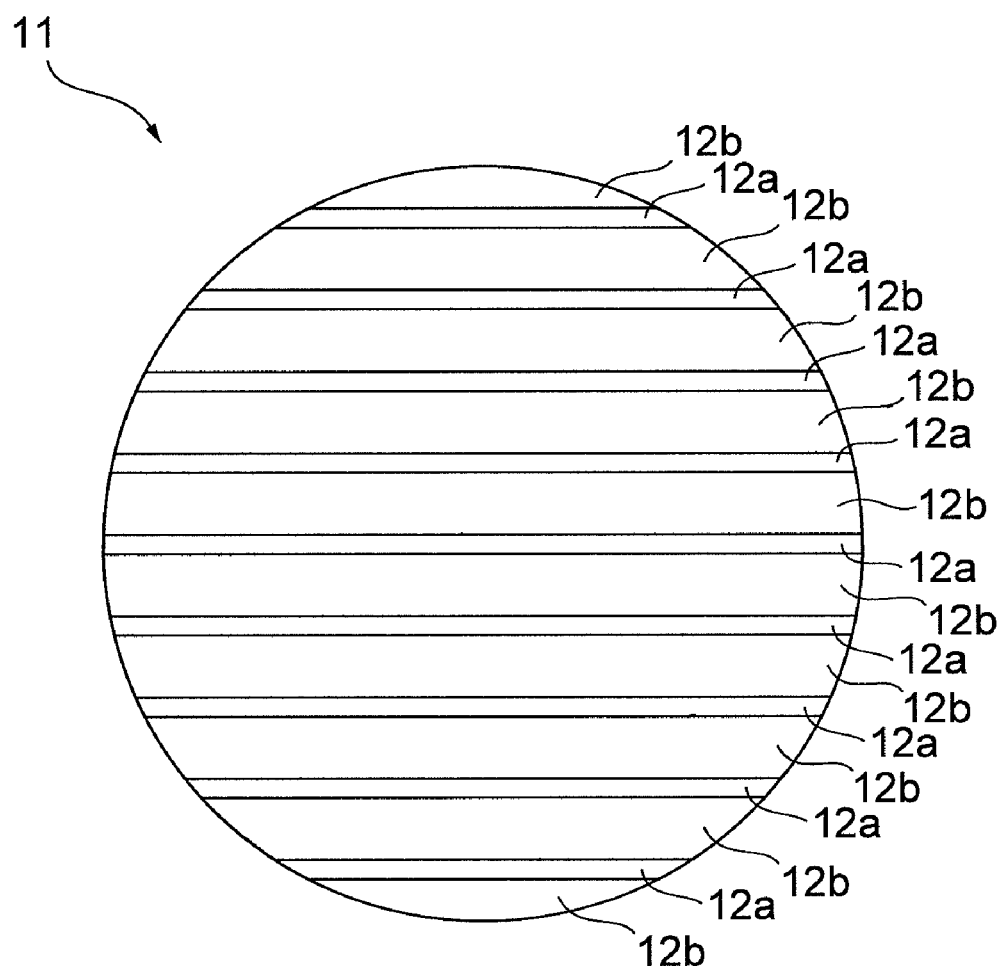
FIG. 8 is a diagram showing a structure of a GaN substrate that can be used in the embodiments according to the present invention.

FIG. 8 is a diagram showing the structure of a GaN substrate that can be used in the present embodiments. The substrate 11 may include a plurality of first regions and a plurality of second regions 12b. The first regions 12a extend in the direction of the c-axis and have a threading dislocation density larger than the first threading dislocation density, and the second regions 12b extend in the direction of the c-axis and have a threading dislocation density smaller than the first threading dislocation density. The first and second regions 12a and 12b reach the primary surface 11a of the substrate 11, and the widths of the first and second regions 12a and 12b in the primary surface 11a of the substrate 11 are, for example, 500 μm and 5000 μm, respectively. The first and second regions 12a and 12b are alternately arranged in a predetermined direction in a plane where the primary surface extends. When the substrate is composed of gallium nitride, the predetermined direction may be the direction of the a-axis of the gallium nitride.

The first regions 12a are made of a high-defect-density region of semiconductor with a high dislocation density, whereas the second regions 12b are made of a low-defect-density region of semiconductor with a low dislocation density. Forming a nitride semiconductor light-emitting device in the low dislocation density region of the substrate 11 can enhance its light-emitting efficiency and reliability. When the second regions 12b have a threading dislocation density of less than $1 \times 10^7$ cm$^{-2}$, the semiconductor laser using the relevant substrate can be provided with reliability sufficient for practical use.

EXAMPLE 1

Figure 9:
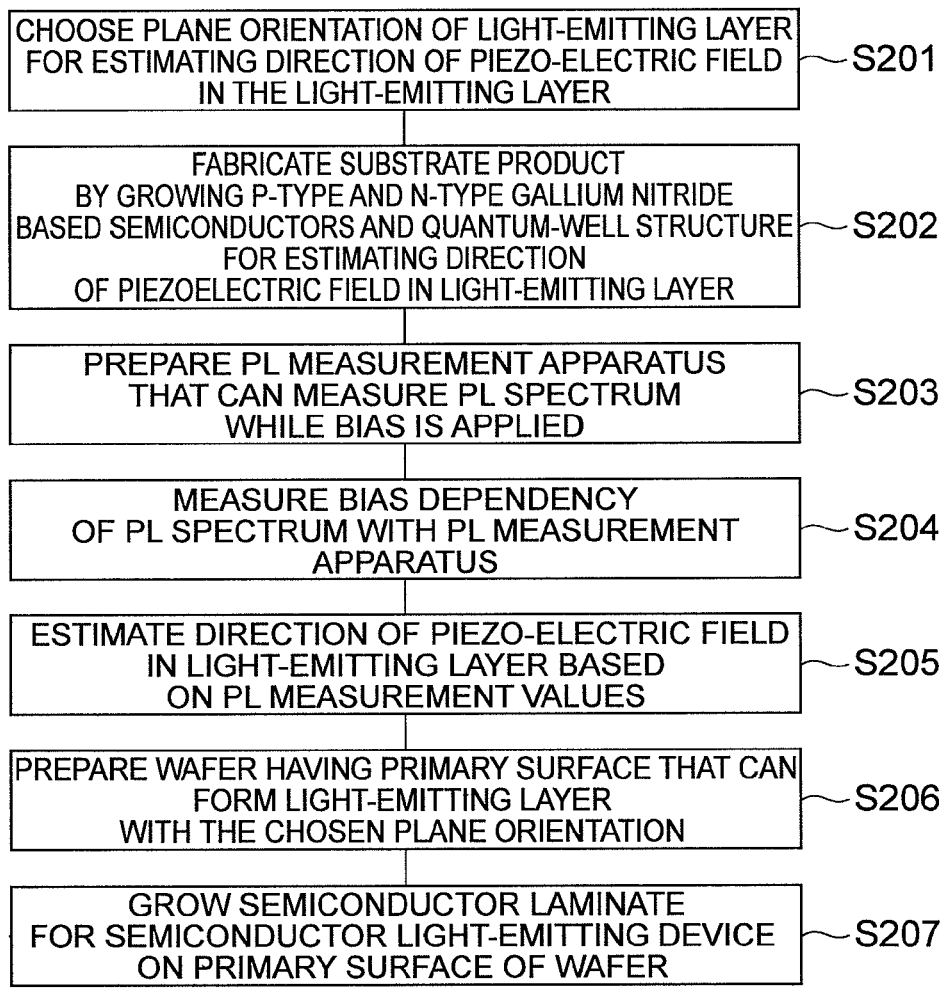
FIG. 9 is a flowchart showing the method of estimating the direction and magnitude of a piezoelectric field in a well layer.

Gallium nitride semiconductor wafers with primary surfaces having different off angles were prepared, and the directions of piezoelectric fields in light-emitting layers were estimated. FIG. 9 is a flowchart showing the method of estimating the direction and the magnitude of the piezoelectric field of a well layer.

In the following description, wafers of GaN were used. In step S201, in order to estimate the direction of the piezoelectric field in a light-emitting layer, a plane orientation of the light-emitting layer is selected.

In step S202, a quantum-well structure for estimating the direction of the piezoelectric field in the light-emitting layer was formed so as to have a selected plane orientation, and p-type and n-type gallium nitride semiconductors were grown to fabricate epitaxial wafers. After the growth, a cathode and an anode were formed on each epitaxial wafer to produce a substrate product.

For example, light-emitting devices having a structure shown in FIG. 1 were grown on the following GaN wafers: GaN wafer with a c-plane (referred to as device name: C); GaN wafers with 75-degree-off plane toward the direction of the m-axis (referred to as device names: M75_1 and M75_2), and GaN wafers with 58-degree-off plane toward the direction of the a-axis (referred to as device names: A58_1, A58_2, and A58_3). A candidate of the above 75-degree-off plane toward the direction of the m-axis is (20-21) plane, and a candidate of the above 58-degree-off plane toward the direction of the a-axis is (11-22) plane. An example of the structure of the substrate products:

Wafer: n-type GaN single crystal,
Si-doped $Al_{0.12}Ga_{0.88}N$: 50 nanometers,
Si-doped GaN layer: 2000 nanometers,
Si-doped $In_{0.02}Ga_{0.98}N$ layer: 100 nanometers,
Undoped $In_{0.20}Ga_{0.80}N$ well layer: 3 nanometers,
Undoped GaN barrier layer: 15 nanometers,
Mg-doped $Al_{0.16}Ga_{0.84}N$ layer: 20 nanometers,
Mg-doped GaN layer: 25 nanometers, and
Heavily Mg-doped GaN layer: 25 nanometers.

Figure 10:
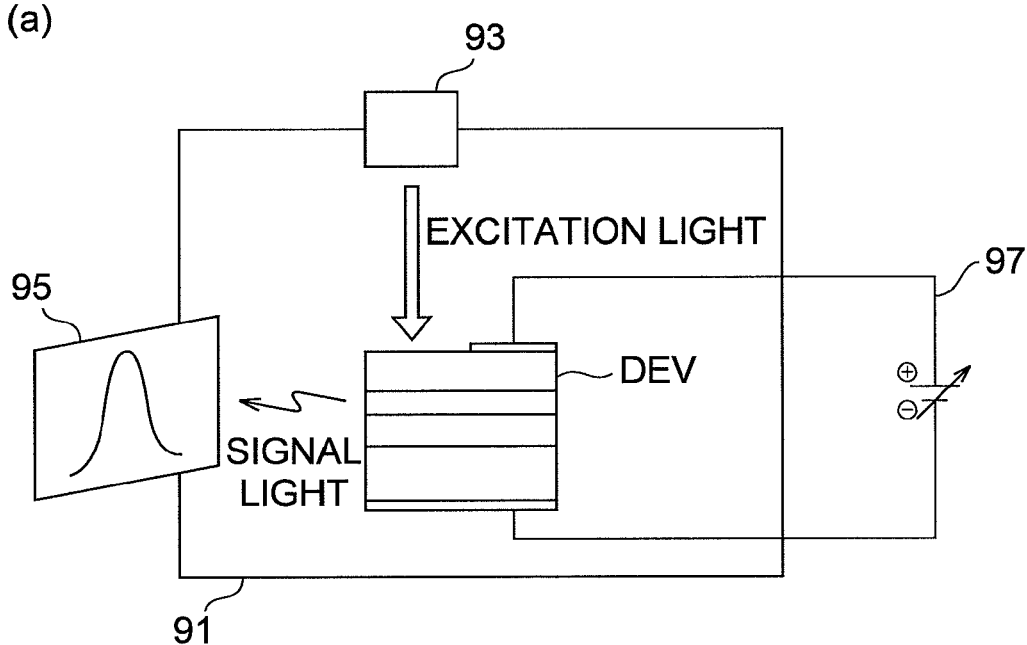
FIG. 10 is a view illustrating the measurement of bias-dependence of PL.
Figure 10:
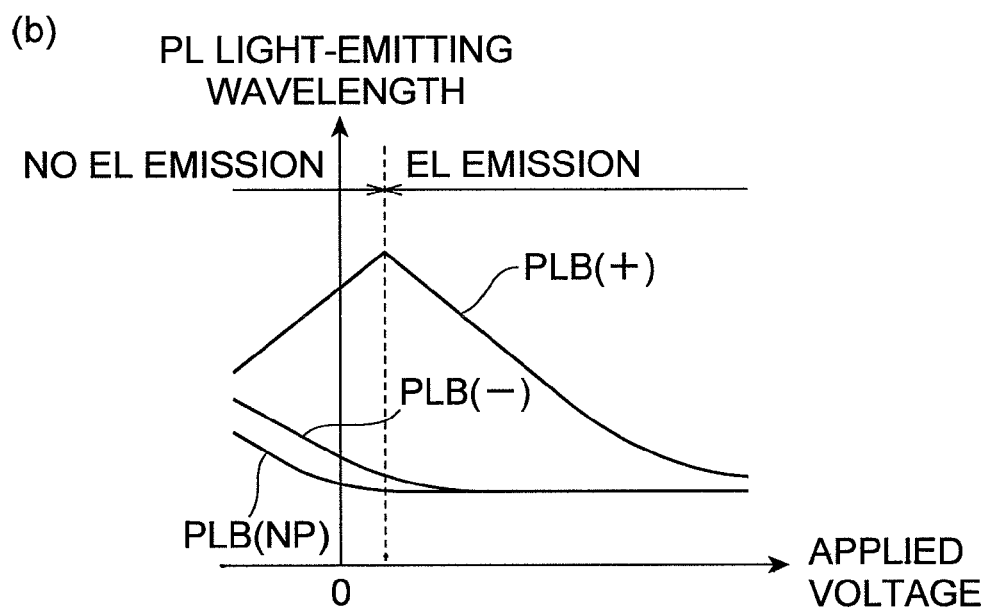

In step S203, a PL measurement apparatus was prepared, and by use of this apparatus, PL measurement of the devices formed above can be performed while biased voltage was applied thereto. Part (a) of FIG. 10 is a schematic diagram showing an example of the structure of the PL measurement apparatus. The PL measurement apparatus includes an excitation light source 93 for irradiating a device DEV with excitation light, a PL detector 95 for detecting photoluminescence from the device DEV, and a section 97 for applying a variable bias to the device DEV.

In step S204, the dependency of the photoluminescence on bias was measured while bias was applied to the substrate product. Part (b) of FIG. 10 reveals that the observed results of bias dependency shown as, for example, characteristic curves. The device DEV emits electroluminescence when it is energized with a forward bias voltage exceeding a certain level of intensity. The electroluminescence is not generated when the forward bias is small or is reversed.

The devices formed on a semipolar plane having an off angle within a certain range and on the c-plane of a GaN wafer exhibits the generation of a positive piezoelectric field in the light-emitting layer. The characteristic curve PLB(+) of part (b) of FIG. 10 shows characteristics of these devices. In the bias lower than the EL light-emission voltage, the peak wavelength of the PL light-emission shifts toward longer wavelengths with an increase in the bias. In the voltage over the EL light-emission voltage, the peak wavelength shifts toward shorter wavelengths with an increase in the bias.

In the device formed on a nonpolar plane of the GaN wafer, the piezoelectric field in the light-emitting layer is zero. The characteristic curve PLB(NP) of part (b) of FIG. 10 shows characteristics of this device. Before the bias reaches the zero voltage, the peak wavelength of the PL light-emission slightly shifts toward shorter wavelengths with an increase in the bias, but does not substantially shift at a positive bias.

The device formed on a semipolar plane having a specific off angle range according to this embodiment generates a negative piezoelectric field in the light-emitting layer. The characteristic curve PLB(−) of part (b) of FIG. 10 shows characteristics of this device. Before the bias reaches the EL light-emission voltage, the peak wavelength of the PL light-emission slightly shifts toward shorter wavelengths with an increase in the bias.

In step 205, the direction of the piezoelectric field in the light-emitting layer is estimated from the measured bias dependency. The direction of the piezoelectric field in the light-emitting layer can be determined based on part (b) of FIG. 10.

In step 206, a wafer is prepared which has a primary surface that can fabricate a light-emitting layer with the selected plane orientation. In step S207, a semiconductor laminate for the semiconductor light-emitting device is formed on the primary surface of this wafer. As shown in FIGS. 1 and 4, the semiconductor laminate can include the first gallium nitride based semiconductor region 13, the light-emitting layer 15, and the second gallium nitride based semiconductor region 17. The light-emitting layer 15 includes well layers and barrier layers. Each of the well layers and the barrier layers extends along a reference plane tilting from planes orthogonal to the reference axes that extend in the directions of the c-axis, the a-axis, and the m-axis. The light-emitting layer 15 is provided between the first gallium nitride based semiconductor region 13 and the second gallium nitride based semiconductor region 17. The direction of the piezoelectric field is defined with reference to the direction that is from the second gallium nitride based semiconductor region 17 toward the first gallium nitride based semiconductor region 13. Since the dependency of PL spectrum on bias is measured while bias is applied thereto, photoluminescence can be obtained in the range of the negative application voltage and positive application voltage smaller than the application voltage at which light by electroluminescence emits. The magnitude and the direction of the internal electrical field in the light-emitting layer can be estimated using the bias dependency of photoluminescence.

Figure 11:
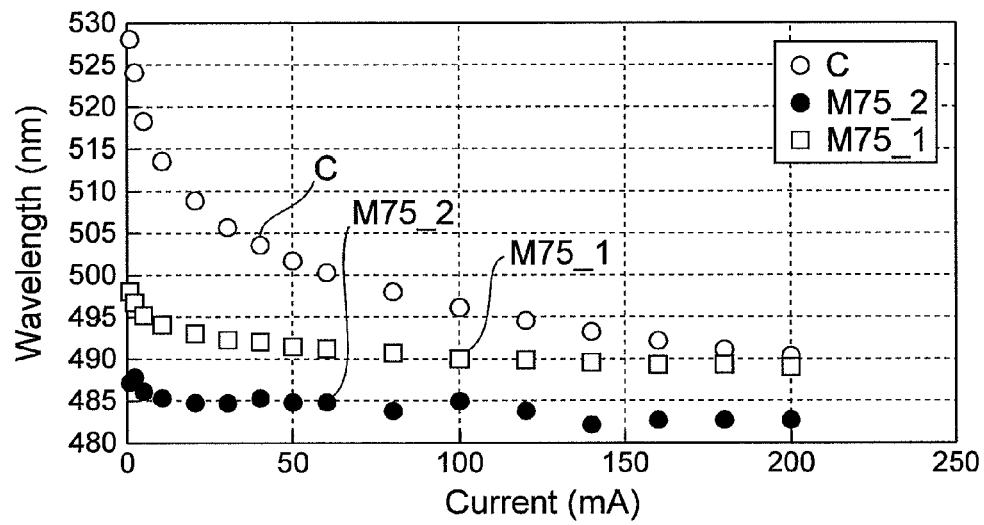
FIG. 11 is a view showing observed EL spectra of a semiconductor light-emitting device fabricated in an example.
Figure 11:
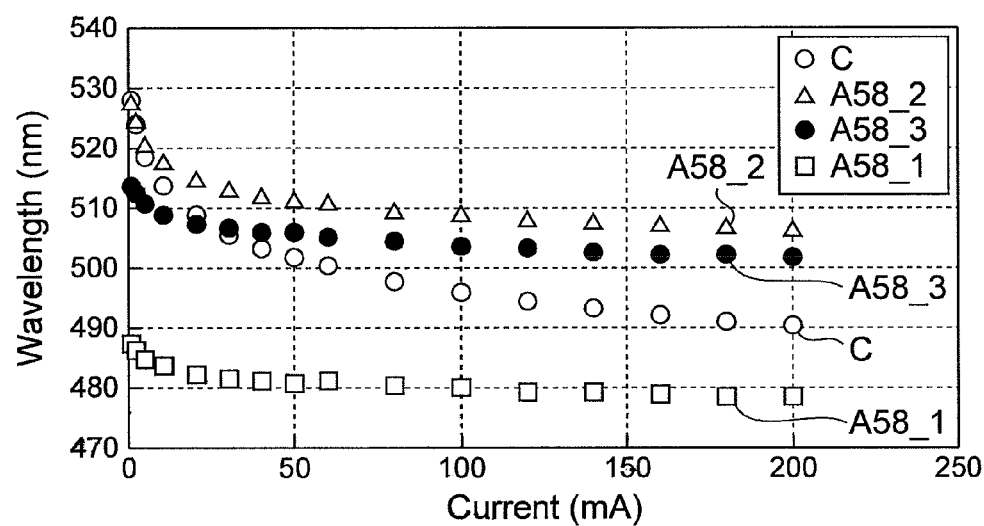

FIG. 11 shows the results of observed EL spectra of semiconductor light-emitting devices formed in an example. With reference to FIG. 11, the amount of the blue shift on the GaN c-plane (referred to as device name: C) is about 30 nanometers at the applied current of 120 mA. The amount of the blue shift on the 75-degree-off plane toward the m-axis (referred to as device name: M75_1 and M75_2) is about 4 to 7 nanometers. The amount of the blue shift on the 58-degree-off plane toward the a-axis (referred to as device name: A58_1, A58_2, and A58_3) is about 7 to 16 nanometers.

The 75-degree-off plane in the m-direction and the 58-degrees-off plane in the a-direction exhibit small blue shifts, whereas the device on the c-plane exhibits a very large blue shift. In particular, the 75-degree-off plane in the m-direction can reduce blue shift. This is advantageous in that the color tone of a light-emitting diode does not vary depending on an applied current and that a laser diode provides a long wavelength oscillation.

A c-plane, a 75-degree-off plane in the direction of the m-axis, and a 58-degree-off plane in the direction of the a-axis were prepared, and light-emitting diodes (LEDs) were fabricated similarly. The LEDs were energized to measure EL spectra at variable temperatures of the LEDs.

Figure 12:
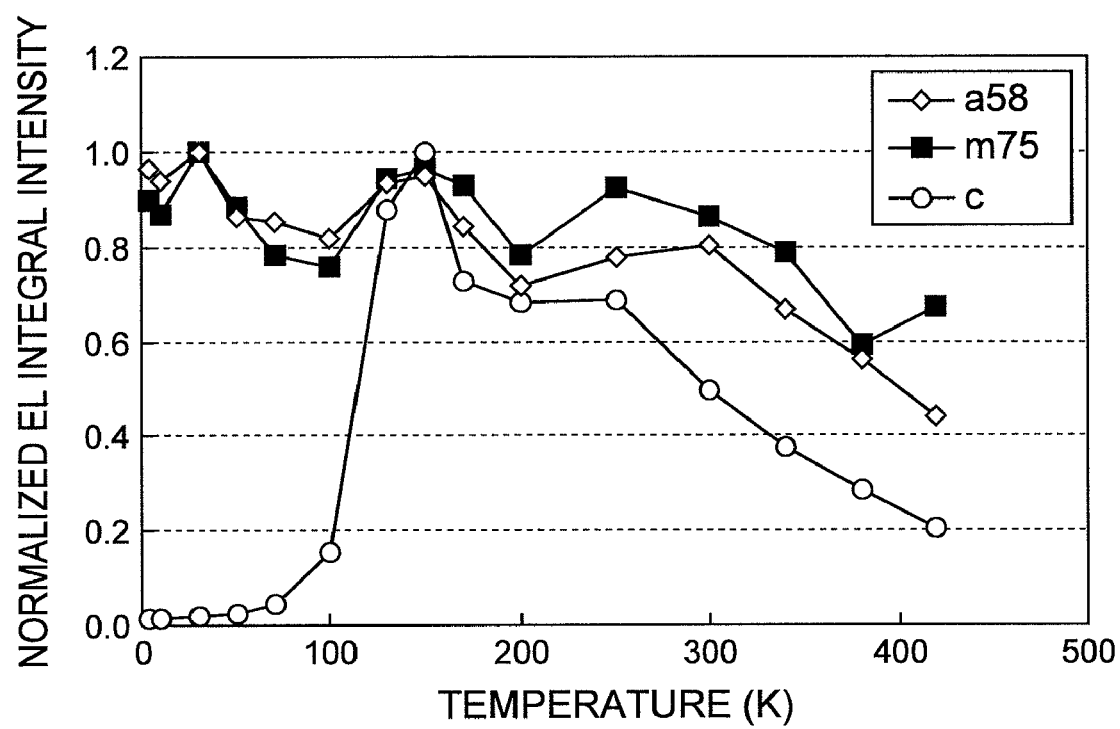
FIG. 12 is a graph showing temperature dependency of integrated intensity.
Figure 13:
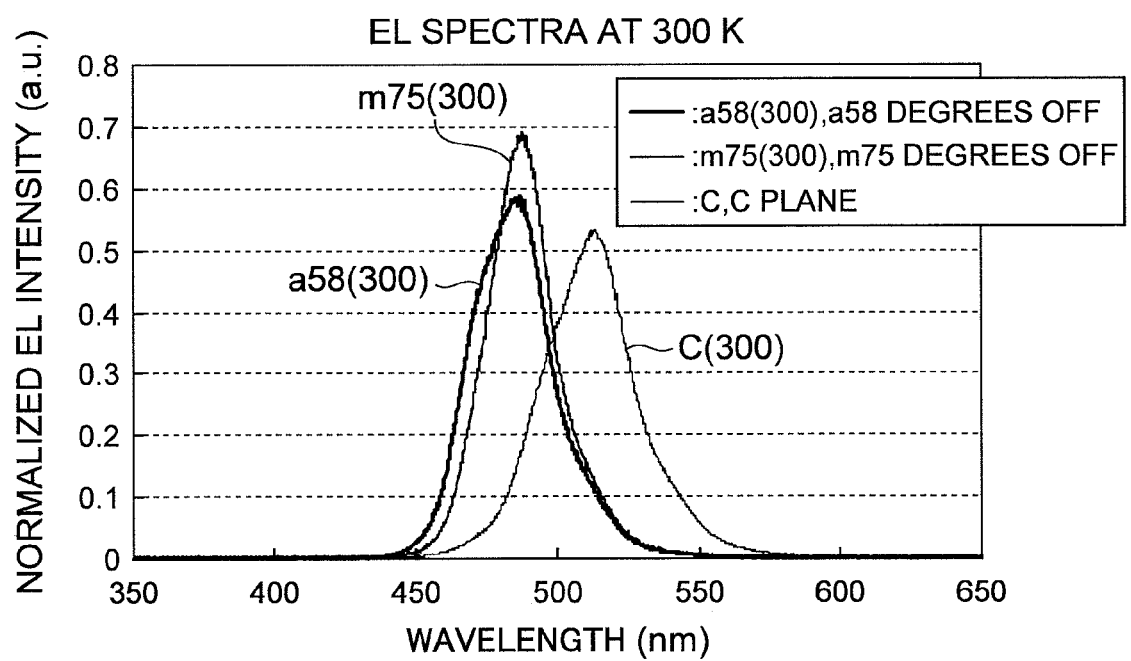
FIG. 13 is a graph showing electroluminescence (EL) spectra measured at an absolute temperature of 300 K.
Figure 14:
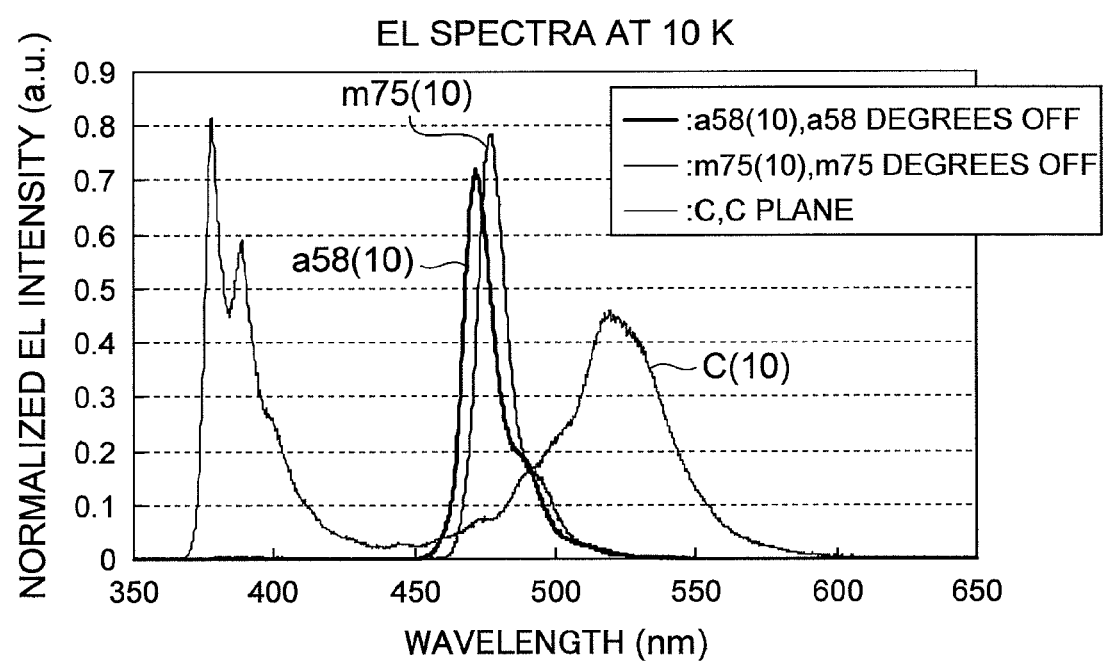
FIG. 14 is a graph showing EL spectra measured at an absolute temperature of 10 K.

As shown in FIG. 12, in terms of the dependency of the integral intensity on temperature, the LED (characteristic curve: c) on the c-plane exhibits a steep decrease in the integral intensity in the temperature range of 150 K or less, whereas the LED (characteristic curve: m75) on the 75-degree-off plane in the direction of the m-axis and the LED (characteristic curve: a50) on the 58-degree-off plane in the direction of the a-axis both do not exhibit any substantial decrease in integral intensity in the low temperature range. As shown in FIG. 13, the comparison of the EL spectra reveals that each of the three LEDs (refer to three characteristic curves in FIG. 13 as m75(300), a58(300), and c(300)) shows the single peak of emission from the only light-emitting layer at an absolute temperature of 300 K. On the other hand, as shown in FIG. 14, only the LED on the c-plane exhibits an additional peak around 380 nanometers (refer to three characteristic curves in FIG. 14 as m75(10), a58(10), and c(10)) at an absolute temperature of 10 K. The additional peak indicates that electrons overflowing from the light-emitting layer recombine with holes in the p-type layer to emit the light. That is, in the LED on the c-plane, since the activation rate of the acceptor decreases at low temperature, a dip of the conduction band at the interface between the light-emitting layer and the p-type layer becomes large, thereby causing electrons to significantly overflow. This phenomenon is not observed in the LEDs on the 75-degree-off plane in the direction of the m-axis and the LED on the 58-degree-off plane in the direction of the a-axis, resulting in fewer overflows of electrons in these LEDs.

EXAMPLE 2

Figure 15:
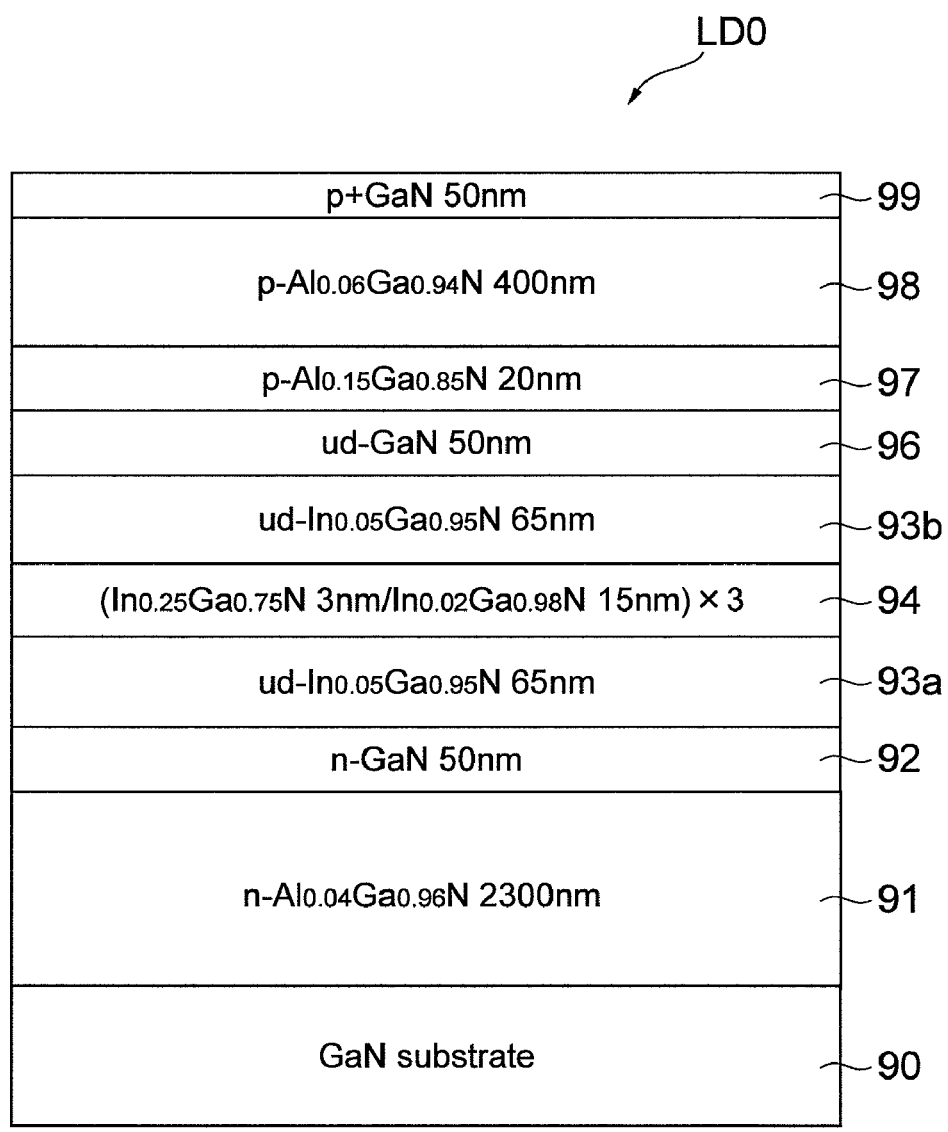
FIG. 15 is a diagram showing the structure of a semiconductor laser fabricated in an example.

A semiconductor laser LD0 having a structure shown in FIG. 15 was fabricated. A GaN wafer 90 with an off-angle of 75 degrees in the direction of the m-axis was prepared. The GaN wafer 90 was placed in a reactor, and was heat-treated in an atmosphere containing ammonia and hydrogen. The heat treatment temperature was set at a temperature of 1100° C., and the heat treatment was performed for about 10 minutes.

After the heat treatment, TMG (98.7 μmol/min), TMA (8.2 μmol/min), NH$_3$ (6 slm), and SiH$_4$ were supplied to the reactor to grow an n-type AlGaN layer 91 for a cladding layer on the GaN wafer 90 at a temperature of 1150° C. The thickness of the n-type AlGaN layer 91 was 2300 nanometers, the growth rate of the n-type AlGaN layer 91 was 46.0 nm/min, and the Al composition of the n-type AlGaN layer 91 was 0.04.

Then, TMG (98.7 μmol/min), NH$_3$ (5 slm), and SiH$_4$ were supplied to the reactor to grow an n-type GaN layer 92 on the n-type AlGaN layer 91 at a temperature of 1150° C. The thickness of the n-type GaN layer 92 was 50 nanometers, and the growth rate of the n-type GaN layer 92 was 58.0 nm/min.

TMG (24.4 μmol/min), TMI (4.6 μmol/min), and NH$_3$ (6 slm) were supplied to the reactor to grow an undoped InGaN layer 93*a* for an optical guide layer on the n-type GaN layer 94 at a temperature of 840° C. The thickness of the n-type InGaN layer 93*a* was 65 nanometers, the growth rate of the n-type InGaN layer 93*a* was 6.7 nm/min, and the indium composition of the undoped InGaN layer 93*a* was 0.05.

Then, an active layer 94 was grown thereon. TMG (15.6 mmol/min), TMI (29.0 μmol/min), and NH$_3$ (8 slm) were supplied to the reactor to grow an undoped InGaN well layer at a temperature of 745° C. The thickness of the InGaN layer was 3 nanometers, and the growth rate of the InGaN layer was 3.1 nm/min.

Then, TMG (15.6 μmol/min), TMI (0.3 μmol/min), and NH$_3$ (8 slm) were supplied to the reactor, while the temperature of the reactor was maintained at a temperature of 745° C., to grow an undoped GaN layer on the InGaN layer. The thickness of the GaN layer was one nanometer, and the growth rate of the GaN layer was 3.1 nm/min. After the growth of the undoped GaN layer, the temperature of the reactor was changed from 745° C. to 870° C., and TMG (24.4 μmol/min), TMI (1.6 μmol/min), and NH$_3$ (6 slm) were supplied to the reactor to grow an undoped InGaN layer for a barrier layer on the undoped InGaN well layer at a temperature of 870° C. The thickness of the InGaN layer was 15 nanometers, and the growth rate of the InGaN layer was 6.7 nm/min. The In composition of the undoped InGaN layer was 0.02.

Then, the temperature of the reactor was changed from 870° C. to 745° C., and TMG (15.6 μmol/min), TMI (29.0 μmol/min), and NH$_3$ (8 slm) were supplied to the reactor to grow an undoped InGaN well layer on the InGaN layer at a temperature of 745° C. The thickness of the InGaN layer was 3 nanometers, and the growth rate of the InGaN layer was 3.1 nm/min. The In composition of the undoped InGaN layer was 0.25.

The growth of the well layer, the protective layer, and the barrier layer were repeated twice, and a well layer and a protective layer were further grown thereon. Then, TMG (13.0 μmol/min), TMI (4.6 μmol/min), and NH$_3$ (6 slm) were supplied to the reactor to grow an undoped InGaN layer 93*b* for an optical guide layer on the active layer 94 at a temperature of 840° C. The thickness of the InGaN layer 93*b* was 65 nanometers, and the growth rate of the InGaN layer 93*b* was 6.7 nm/min. Then, TMG (98.7 μmol/min) and NH$_3$ (5 slm) were supplied to the reactor to grow an undoped GaN layer 96 on the InGaN layer 93*b* at a temperature of 1100° C. The thickness of the GaN layer 96 was 50 nanometers, and the growth rate of the GaN layer 96 was 58.0 nm/min. The In composition of the undoped InGaN layer 93*b* was 0.05.

Then, TMG (16.6 μmol/min), TMA (2.8 μmol/min), NH$_3$ (6 slm), and Cp$_2$Mg were supplied to the reactor to grow a p-type AlGaN layer 97 on the GaN layer 96 at a temperature of 1100° C. The thickness of the AlGaN layer 97 was 20 nanometers, and the growth rate of the AlGaN layer 97 was 4.9 nm/min. The Al composition of the p-type AlGaN layer 97 was 0.15.

TMG (36.6 μmol/min), TMA (3.0 μmol/min), NH$_3$ (6 slm), and Cp$_2$Mg were supplied to the reactor to grow a p-type AlGaN layer 98 on the p-type AlGaN layer 97 at a temperature of 1100° C. The thickness of the AlGaN layer 98 was 400 nanometers, the Al composition was 0.06, and the growth rate of the AlGaN layer 98 was 13.0 nm/min. Furthermore, TMG (34.1 μmol/min), NH$_3$ (5 slm), and Cp$_2$Mg were supplied to the reactor to grow a p-type GaN layer 99 on the p-type AlGaN layer 98 at a temperature of 1100° C. The thickness of the GaN layer 99 was 50 nanometers, and the growth rate of the p-type GaN layer 99 was 18.0 nm/min. Through these steps, an epitaxial wafer was fabricated. An anode and a cathode were formed on this epitaxial wafer to provide a semiconductor diode as shown in the drawing. The anode was electrically connected to the p-type GaN layer via a stripe window with a width of 10 μm which the insulating film has. The anode was composed of Ni/Au, and the cathode was composed of Ti/Al/Ti/Au. By a-plane cleavage, a laser bar with a length of 600 μm was formed. The lasing wavelength was 520 nanometers, and the threshold current was 900 mA.

Having described and illustrated the principle of the invention in a preferred embodiment thereof, it is appreciated by those having skill in the art that the invention can be modified in arrangement and detail without departing from such principles. The present invention is not limited to the specific configurations described in the embodiments. We therefore claim all modifications and variations coming within the spirit and scope of the following claims.

The invention claimed is:

1. A nitride based semiconductor optical device comprising:
a first gallium nitride based semiconductor region;
a light-emitting layer including a well layer and a barrier layer, the well layer being composed of a strained hexagonal gallium nitride based semiconductor, and the barrier layer being composed of gallium nitride based semiconductor;
a second gallium nitride based semiconductor region;
a substrate of a hexagonal semiconductor of $In_SAl_TGa_{1-S-T}N$ ($0 \leq S \leq 1$, $0 \leq T \leq 1$, $0 \leq S+T \leq 1$);
a first electrode; and
a second electrode provided on a back side of the substrate, the well layer comprising InGaN,
the barrier layer comprising a ternary InGaN, a composition of the ternary InGaN being different from the composition of InGaN of the well layer,
the light-emitting layer being provided between the first gallium nitride based semiconductor region and the second gallium nitride based semiconductor region,
the first gallium nitride based semiconductor region including one or more n-type gallium nitride semiconductor layers,
the second gallium nitride based semiconductor region including a gallium nitride based semiconductor layer and one or more p-type gallium nitride semiconductor layers, the gallium nitride based semiconductor layer having a band gap larger than that of the barrier layer,
each of the well layer and the barrier layer extending along a reference plane,
the reference plane tilting at a tilt angle in the range of 75 degrees to less than 80 degrees and greater than 150 degrees to less than 180 degrees with respect to a plane orthogonal to a reference axis, the reference axis extending in a direction of a c-axis;
the reference plane tilting toward a direction of an m-axis or an a-axis;
the first gallium nitride based semiconductor region, the light-emitting layer, and the second gallium nitride based semiconductor region being arranged in a direction of a first vector, the first vector indicating a normal direction of the primary surface of the substrate;
the primary surface of the substrate extending along a reference plane tilting with respect to a plane orthogonal to a second vector at a tilt angle in a range of 75 degrees or more to less than 80 degrees and greater than 150 degrees to less than 180 degrees, the second vector indicating a c-axis of the hexagonal semiconductor, the first and second vectors forming the tilt angle;
a piezoelectric field in the light-emitting layer including a component of a direction opposite to a direction from the second gallium nitride based semiconductor region toward the first gallium nitride based semiconductor region;
the gallium nitride based semiconductor layer of the second gallium nitride based semiconductor region being adjacent to the light-emitting layer; and
the gallium nitride based semiconductor layer of the second gallium nitride based semiconductor region including an electron blocking layer, the gallium nitride based semiconductor layer comprising AlGaN;
the first gallium nitride based semiconductor region, the light-emitting layer, and the second gallium nitride based semiconductor region constituting a semiconductor laminate on the primary surface of the substrate;
the substrate having an electrical conductivity; and
the first electrode being provided on the semiconductor laminate; and
the nitride based semiconductor optical device comprising a semiconductor laser.

2. The nitride based semiconductor optical device according to claim 1, wherein the tilt angle is in the range of 75 degrees to less than 80 degrees.

3. The nitride based semiconductor optical device according to claim 1, wherein the primary surface of the substrate comprises a (20-21) plane.

4. The nitride based semiconductor optical device according to claim 1, wherein the tilt angle is in the range of greater than 150 degrees to 170 degrees.

5. The nitride based semiconductor optical device according to claim 1, wherein the nitride based semiconductor optical device exhibits a photoluminescence spectrum measured by applying a forward biasing voltage across the first and second electrodes thereof, the photoluminescence spectrum has a peak wavelength, and the peak wavelength has a voltage dependency and shifts toward short wavelength in the forward biasing voltage ranging from zero volt to a voltage at which the biased nitride based semiconductor optical device starts to emit electroluminescence.

6. The nitride based semiconductor optical device according to claim 1, wherein the light-emitting layer includes first and second optical guide layers and an active layer having a quantum-well structure;
the quantum-well structure includes the well layer and the barrier layer; and
the active layer is provided between the first optical guide layer and the second optical guide layer.

7. The nitride based semiconductor optical device according to claim 1, wherein the gallium nitride based semiconductor layer comprises a cladding layer, and the cladding layer comprises p-type $Al_XGa_YIn_{1-X-Y}N$ ($0<X \leq 1$, $0 \leq Y \leq 1$, $0<X+Y \leq 1$) containing at least aluminum.

8. The nitride based semiconductor optical device according to claim 7, wherein the substrate includes plural first regions and plural second regions, the first regions extend in a direction of the c-axis and have a threading dislocation density larger than a first threading dislocation density, and the second regions extend in the direction of the c-axis and have a threading dislocation density smaller than the first threading dislocation density;
the first and second regions are alternately arranged; and
the first and second regions reach the primary surface of the substrate.

9. The nitride based semiconductor optical device according to claim 8, wherein the second regions have a threading dislocation density of less than $1 \times 10^7$ cm$^{-2}$.

10. The nitride based semiconductor optical device according to claim 1, wherein the reference plane tilts toward a direction of the a-axis.

11. The nitride based semiconductor optical device according to claim 1, wherein the reference plane tilts toward a direction of the m-axis.

* * * * *